United States Patent
Hisamoto et al.

(10) Patent No.: US 12,396,374 B2
(45) Date of Patent: Aug. 19, 2025

(54) SEMICONDUCTOR DEVICE COMPRISING PLURALITY OF DIFFUSION LAYER ELECTRODES WITH DIFFERENT CONDUCTIVITIES AND GATE ELECTRODES

(71) Applicant: Hitachi, Ltd, Tokyo (JP)

(72) Inventors: Digh Hisamoto, Tokyo (JP); Satoru Akiyama, Tokyo (JP); Toshiyuki Mine, Tokyo (JP); Noriyuki Lee, Tokyo (JP); Gou Shinkai, Tokyo (JP); Shinichi Saito, Tokyo (JP); Ryuta Tsuchiya, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 756 days.

(21) Appl. No.: 17/590,965

(22) Filed: Feb. 2, 2022

(65) Prior Publication Data

US 2022/0271213 A1  Aug. 25, 2022

(30) Foreign Application Priority Data

Feb. 24, 2021  (JP) ................... 2021-027123

(51) Int. Cl.
*H10N 60/10* (2023.01)
*G06N 10/40* (2022.01)
(Continued)

(52) U.S. Cl.
CPC ........... *H10N 60/128* (2023.02); *G06N 10/40* (2022.01); *H10N 60/01* (2023.02); *H10N 60/11* (2023.02); *H10N 69/00* (2023.02)

(58) Field of Classification Search
CPC ...... H10N 60/128; H10N 60/11; H10N 69/00; H10N 60/00; G06N 10/40; G06N 10/00;
(Continued)

(56) References Cited

U.S. PATENT DOCUMENTS

2007/0063182 A1* 3/2007 Yang ............... B82Y 10/00
257/14
2010/0270534 A1  10/2010 Pioro-Ladriere et al.
(Continued)

FOREIGN PATENT DOCUMENTS

JP         2018-532255 A     11/2018
WO   WO 2009/072550 A1      6/2009

OTHER PUBLICATIONS

Johnson et al., "Singlet-Triplet Spin Blockade And Charge Sensing in a Few-Electron Double Quantum Dot", Physical Review, 2005, pp. 165308-1-165308-7, vol. B, No. 72, (seven (7) pages).
(Continued)

*Primary Examiner* — Didarul A Mazumder
(74) *Attorney, Agent, or Firm* — Crowell & Moring LLP

(57) ABSTRACT

A semiconductor device includes an active region famed in a semiconductor layer formed on an insulating film famed in a semiconductor substrate and having a first extension portion extending in a first direction and a second extension portion extending in a second direction intersecting with the first direction, a first diffusion layer electrode of a first conductivity type provided in the first extension portion, second and third diffusion layer electrodes of a second conductivity type provided in the second extension portion so as to interpose a first connecting portion connecting the first extension portion and the second extension portion, a first gate electrode famed on the first extension portion between the first diffusion layer electrode and the first connecting portion through an insulating film famed on the semiconductor layer, and a second gate electrode famed on the first connecting portion through the insulating film famed on the semiconductor layer.

14 Claims, 54 Drawing Sheets

(51) Int. Cl.
*H10N 60/01* (2023.01)
*H10N 69/00* (2023.01)

(58) Field of Classification Search
CPC .... H10D 48/40; H10D 62/812; H10D 48/383; H10D 64/512; H10D 30/014; H10D 30/402; H10D 48/3835; H10D 30/43; H10D 62/822; H10D 64/27
USPC .......................................................... 257/39
See application file for complete search history.

(56) References Cited

U.S. PATENT DOCUMENTS

| | | | |
|---|---|---|---|
| 2018/0226451 A1 | 8/2018 | Dzurak et al. | |
| 2019/0044048 A1* | 2/2019 | George | H01L 23/46 |
| 2019/0198618 A1* | 6/2019 | George | H10D 48/40 |
| 2019/0392352 A1* | 12/2019 | Lampert | G06F 1/20 |
| 2020/0052101 A1* | 2/2020 | Petta | H10D 62/822 |

OTHER PUBLICATIONS

Nishiguchi et al., "Room-temperature-Operating Data Processing Circuit Based on Single-Electron Transfer and Detection With Metal-Oxide-Semiconductor Field Effect Transistor Technology", Applied Physics Letters, 2006, pp. 183101-1-183101-3, vol. 88, (four (4) pages).

* cited by examiner

FIG. 1

| ELECTRON | DIGITS |
|---|---|
| ↑ | 0 |
| ↓ | 1 |

FIG. 47

32 (8x4) QUBIT ARRAY

| A | D | G |
|---|---|---|
| B | E | H |
| C | F | I |

FIG. 48

128 (16x8) QUBIT ARRAY

| A | D | D | D | D | G |
|---|---|---|---|---|---|
| B | E | E | E | E | H |
| B | E | E | E | E | H |
| B | E | E | E | E | H |
| B | E | E | E | E | H |
| C | F | F | F | F | I |

SEMICONDUCTOR DEVICE COMPRISING PLURALITY OF DIFFUSION LAYER ELECTRODES WITH DIFFERENT CONDUCTIVITIES AND GATE ELECTRODES

CROSS-REFERENCE TO RELATED APPLICATION

This application claims priority to Japanese Patent Application No. 2021-027123 filed on Feb. 24, 2021, the entire contents of which are incorporated by reference herein.

BACKGROUND

The present invention relates to a signal amplifying element which amplifies and outputs charge amount information of a single electron and a few electrons held in a qubit, and a semiconductor device having the signal amplifying element.

A quantum computer is a computer that is considered to be capable of high-speed information processing compared to the existing computer. While the existing computer handles binary values of "0" and "1", the quantum computer has a feature that it is also capable of handling these superposition states. In order to handle such superposition states, the quantum computer requires elements called qubits. The qubit can be realized by a superconducting element or a semiconductor element.

Even among them, the qubit formed by using a semiconductor micro fabrication technique is considered to be a useful structure because it is easy to scale up due to its high integration and affinity with the present digital computer by a semiconductor chip is high. In the semiconductor qubit, qubits that serve as electrically separated small regions are created, and a spin state of each electron trapped in the qubit is used as information. FIG. 1 shows by ways of example, an electron spin state and a value associated with it. A symbol comprised of a circle and an arrow in the figure is a designed image of each electron spin. Thus, the electron spin is represented as a vector. The basis of the vector means that the electron spin is an upward state (up state) and a downward state (down state). They are associated with the numeric values "0" and "1", for example. Thus, such electron spin control as to change the state of the electron spin associated with the numeric value, e.g., to change its sate from the up state to the down state becomes an operation for the quantum computer. What are the characteristics of qubits is that they can create a superposition of the up and down states. Dealing with the state of superposition of 0 and 1 is impossible for a classic computer and is one of the features of the quantum computer.

Realizing the quantum computer needs to input, calculate, and output information. The input and calculation in the quantum computer are realized by the feeding of individual electrons and the control of the electron spin. An electron spin resonance phenomenon is used for the control of the electron spin. The electron spin resonance phenomenon is generated by a static magnetic field and a vibrating magnetic field to thereby enable the state of the electron spin to be controlled. The magnitude of the static magnetic field is related to the frequency of the vibrating magnetic field with which the electron spin reacts. The amplitude of the vibrating magnetic field is related to the speed at which the electron spin flips between the up state and the down state.

FIG. 2 is a sectional structure of a semiconductor device which realizes qubits of an electron spin system. This sectional structure is a MOS (Metal Oxide Insulator) structure well known in a semiconductor field. This is configured as a structure in which gate electrodes 201 are provided on a semiconductor layer 101 through an insulating layer 901 interposed therebetween. Incidentally, FIG. 2 is a typical diagram and does not show actual gate dimensions and the thickness of the insulating layer. By applying a voltage to the seven parallel-arranged gate electrodes 201 individually, the electrons can be trapped by an electrostatic effect. For example, an appropriate voltage is applied to any of the parallel-arranged gate electrodes 201 to thereby make it possible to trap the electron under the gate electrode by an electrostatic attraction force with the insulating layer 901 being interposed, whereby the trapped electron is utilized as the qubit. Thus, the gate electrode that traps the electron used as the qubit is referred to as a qubit gate (Qubit Gate). When a vibrating magnetic field is generated in the trapped electron and the frequency of the generated vibrating magnetic field matches with the resonance frequency of the electron, it is possible to flip an electron spin. The structure of generating the vibrating magnetic field is omitted in FIG. 2.

In order to realize the quantum computer, there has been known a structure of a semiconductor device in which such a qubit is formed and operated (refer to International Publication No. 2009/072550, Japanese Unexamined Patent Application Publication (Translation of PCT Application) No. 2018-532255, etc.).

SUMMARY

As described above, in the quantum computer with the qubit using the electron spin, its operation is performed by the spin state of each electron. Therefore, in order to output the result of the operation, there is a need to sense and read the spin state. This becomes a big problem in practical use. For example, as a method of reading the spin state, there has been known an optical method called ODMR (Optical Detected Magnetic Resonance). However, in order to perform the optical reading, there is a need to provide a device very larger than for the qubit, thus resulting in losing the advantage of forming the qubit using the semiconductor. Therefore, as a method effective for a semiconductor device that can integrate electrical elements, there has been proposed that using a spin-to-charge conversion method, a spin state is converted into an electric signal and read out (A. C. Johnson et al., "Singlet-triplet spin blockade and charge sensing in a few-electron double quantum dot", Physical Review. B 72, 165308(2005)). The spin-to-charge conversion method will be described using FIG. 3.

As an example of a plurality of qubits famed in parallel like FIG. 2, two bits (Q1 and Q2) made by qubit gates QG1 and QG2 are shown in FIG. 3. A barrier gate BG (Barrier Gate) is provided between the qubit gate QG1 and the qubit gate QG2. A W-shaped broken line typically indicates a potential 230 near a semiconductor surface under each gate. By keeping this structure in a cryogenic state, it is possible to trap one electron in the semiconductor layer under each of the qubit gates QG1 and QG2 and hold its spin state.

FIG. 4 shows a case where the electron spins of the qubits (Q1 and Q2) are both in a down state. Even if a bias is applied to the barrier gate BG to lower a potential barrier between both bits, and tunnel probability that each electron moves from under the qubit gate QG1 to under the qubit gate QG2 is made high, the electron cannot transition between the bits because the Pauli exclusion principle works in this case. Therefore, each of the qubit gates QG1 and QG2 keeps the single electron trapped.

On the other hand, assume that the electron spin of the electron bit Q1 is in the up state, and the electron spin of the electron bit Q2 is in the down state. When the bias is applied to the barrier gate BG to lower the potential barrier between both bits, as shown in FIG. 5, the electrons can be shifted from under the qubit gate QG1 to under the qubit gate QG2, so that the two electrons are kept trapped under the qubit gate QG2.

Thus, the difference in the spin state of the electron bit Q1 can be converted into the difference in the number of electrons 10 under the qubit gate QG2 such as shown in FIGS. 6 and 7 by performing the operations shown in FIGS. 4 and 5. Therefore, if it is possible to electrically read the difference in the number of electrons under the qubit gate QG2, the spin state can be read. This system has a problem in that a charge amount (elementary charge) signal of one electron is required to be sensed and is signal-amplified to a level that can be signal-processed for practical use.

It has been reported in Katsuhiko Nishiguchi, et al., "Room-temperature-operating data processing circuit based on single-electron transfer and detection with metal-oxide-semiconductor field effect transistor technology", Applied Physics Letters 88, 183101(2006) that the amplifying function of a MOSEET is used as the method for amplifying the elementary charge. FIG. 8 shows in a simplified form, a device structure shown in Katsuhiko Nishiguchi, et al., "Room-temperature-operating data processing circuit based on single-electron transfer and detection with metal-oxide-semiconductor field effect transistor technology", Applied Physics Letters 88, 183101(2006). An element is famed using an SOI (Silicon On Insulator) substrate having a thin film single crystal silicon region on a silicon oxide film. FIG. 8 shows a planar arrangement of the element. A single crystal silicon regions 150 and 151 are formed on the silicon oxide film. A diffusion layer 300 which serves as an electron supply source is formed in the single crystal silicon region 150. Further, insulated gates 251 and 252 for feeding electrons individually are formed in a region (protrusion) extended from the diffusion layer 300 to the single crystal silicon region 151 so as to intersect with the extension direction of the protrusion. By applying a bias appropriate to the insulated gates 251 and 252, each electron is fed to the tip of the protrusion isolated by the insulated gate 251, so that each individual electron 10 can be trapped. On the other hand, diffusion layer electrodes 301 and 302 which serve as a source and a drain, and a channel part 120 are formed in the single crystal silicon region 151. Since the tip of the protrusion of the single crystal silicon region 150 exerts an electric field effect on its opposite channel part 120 as a gate electrode, its electric characteristic changes. That is, the elementary charge of the tip of the protrusion of the single crystal silicon region 150 can be read out as a current that flows between the source and drain famed in the single crystal silicon region 151.

In order to take out large, a change in the minute amount of charge in the gate at the MOSFET as a change in channel characteristic, there is a need to generally increase the electric field effect. To this end, it is effective to increase the distance between the gate and the channel and reduce a capacity Cc therebetween. However, in such a micro structure, when the gate-to-channel distance is increased, the proportion of parasitic capacitances Cp that exist in parallel increases, thus resulting in reducing a signal amount exerted on the channel on the contrary. Therefore, there is a need to shorten the distance between the gate and the channel, and there is a limit to the enhancement of the signal amount by the electric field effect.

There is provided a semiconductor device according to one aspect of the present invention, which includes an active region famed in a semiconductor layer famed on an insulating film famed in a semiconductor substrate and having a first extension portion extending in a first direction and a second extension portion extending in a second direction intersecting with the first direction, a first diffusion layer electrode of a first conductivity type provided in the first extension portion, second and third diffusion layer electrodes of a second conductivity type provided in the second extension portion so as to interpose a first connecting portion connecting the first extension portion and the second extension portion, a first gate electrode famed on the first extension portion between the first diffusion layer electrode and the first connecting portion through an insulating film famed on the semiconductor layer, and a second gate electrode famed on the first connecting portion through the insulating film famed on the semiconductor layer.

Since the potential in channel can be directly changed by an electric charge being a signal source, a large current change can be obtained. Other problems and novel features will become apparent from the description and accompanying drawings of the present specification.

BRIEF DESCRIPTION OF THE DRAWINGS

Figure 1:
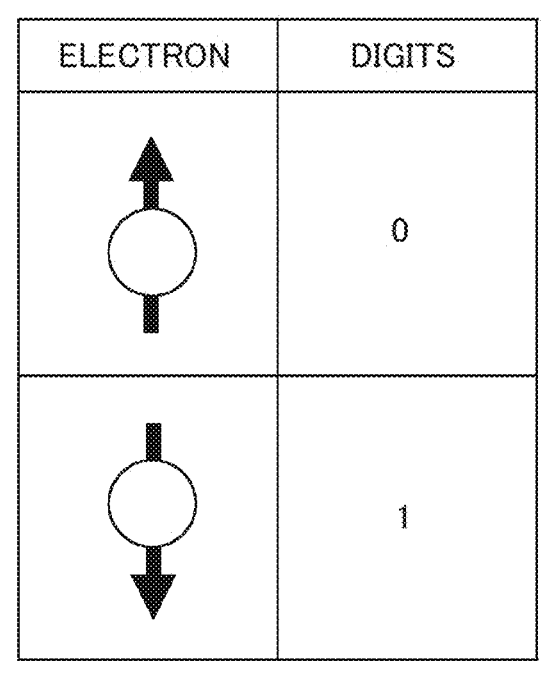

FIG. 1 is a diagram showing a correspondence relationship between an electron spin state and a digit;

FIG. 47 is an example of a qubit array constituted of the basic cells;

FIG. 48 is an example of a qubit array constituted of the basic cells;

DETAILED DESCRIPTION

Figure 2:
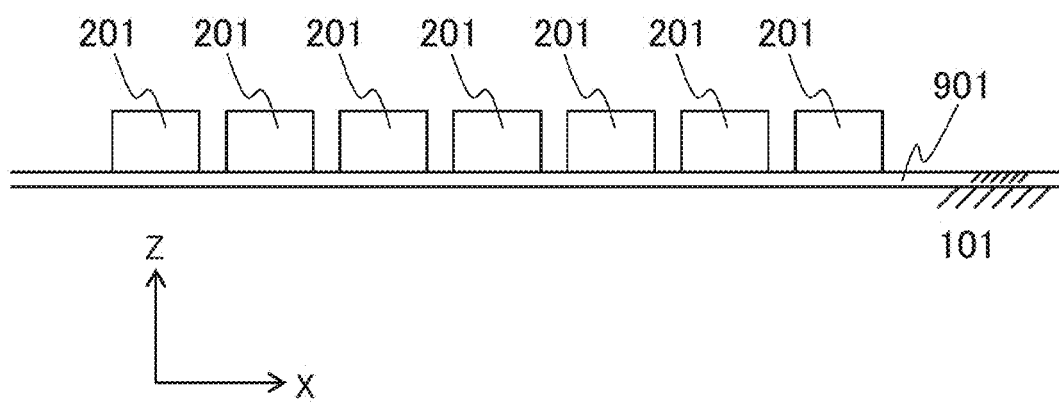
FIG. 2 is a typical diagram showing a sectional structure of a semiconductor device which realizes qubits.

An embodiment of the present invention will hereinafter be described. The embodiment is an example for describing the present invention and is appropriately omitted and simplified for clarification of description. The present invention can also be implemented in various other foams. Unless otherwise specified, the number of components may be singular or plural. Further, the position, shape, range, etc. of each component shown in the drawings may not represent the actual position, size, shape, range, etc. in order to make it easy to understand the invention. Therefore, the present invention is not necessarily limited to the position, size, shape, range, etc. disclosed in the drawings. Also, when there are a plurality of components having the same or similar functions, they may be described by adding different subscripts to the same codes. Further, when it is not necessary to distinguish these plural components, the subscripts may be omitted for explanation.

A charge signal amplifying element will hereinafter be described with qubits used in quantum computers in mind, but a system to be described here can widely be applied to the case where a small-amount charge signal is amplified and output. In particular, since the charge signal amplifying element has a structure that is highly compatible with a CMOS process, it is suitable for a semiconductor device formed by using the CMOS process. Further, the element of the present embodiment can be worked more effectively by operating it in a low temperature environment. For example, generally, a semiconductor device using the present invention is mounted in a refrigerating machine capable of reducing the temperature to $\frac{1}{100}$ by cooling to 3K with respect to the room temperature 300K and cooling to 3K or less, and is operated in a low temperature state, whereby a high-performance quantum computer can be realized.

First Embodiment

Figure 9:
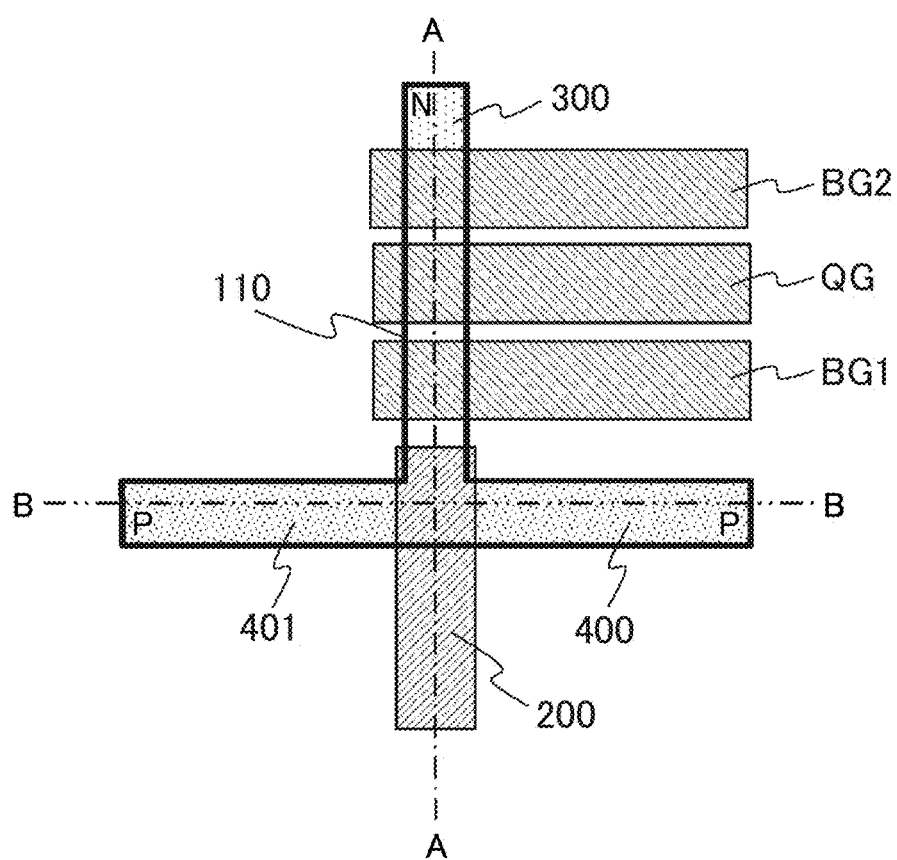
FIG. 9 is a planar arrangement diagram of a charge signal amplifying element.
Figure 10:
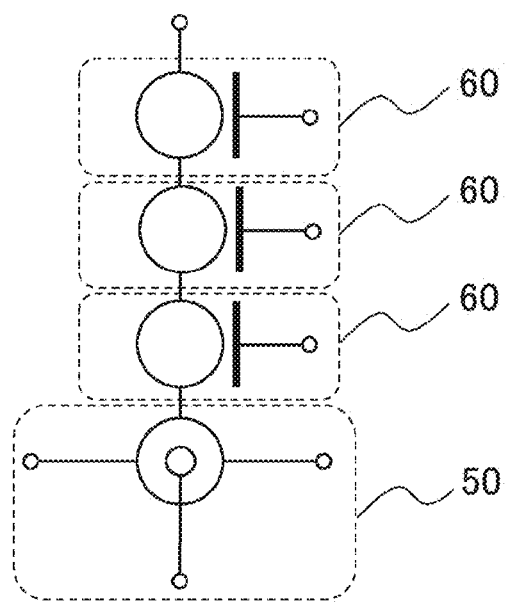
FIG. 10 is an equivalent circuit diagram corresponding to FIG. 9.
Figure 11:
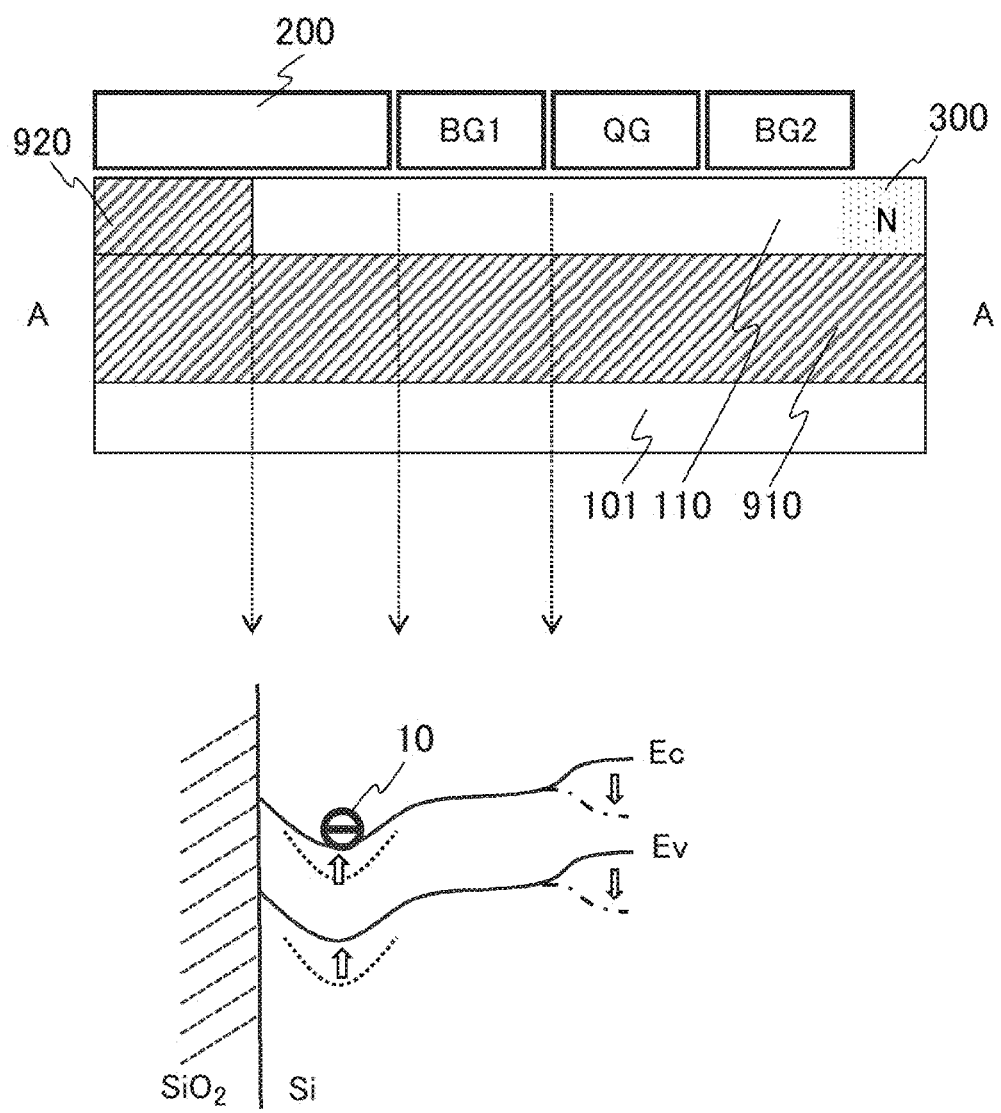
FIG. 11 is a sectional structure and potential diagram of the charge signal amplifying element.
Figure 12:
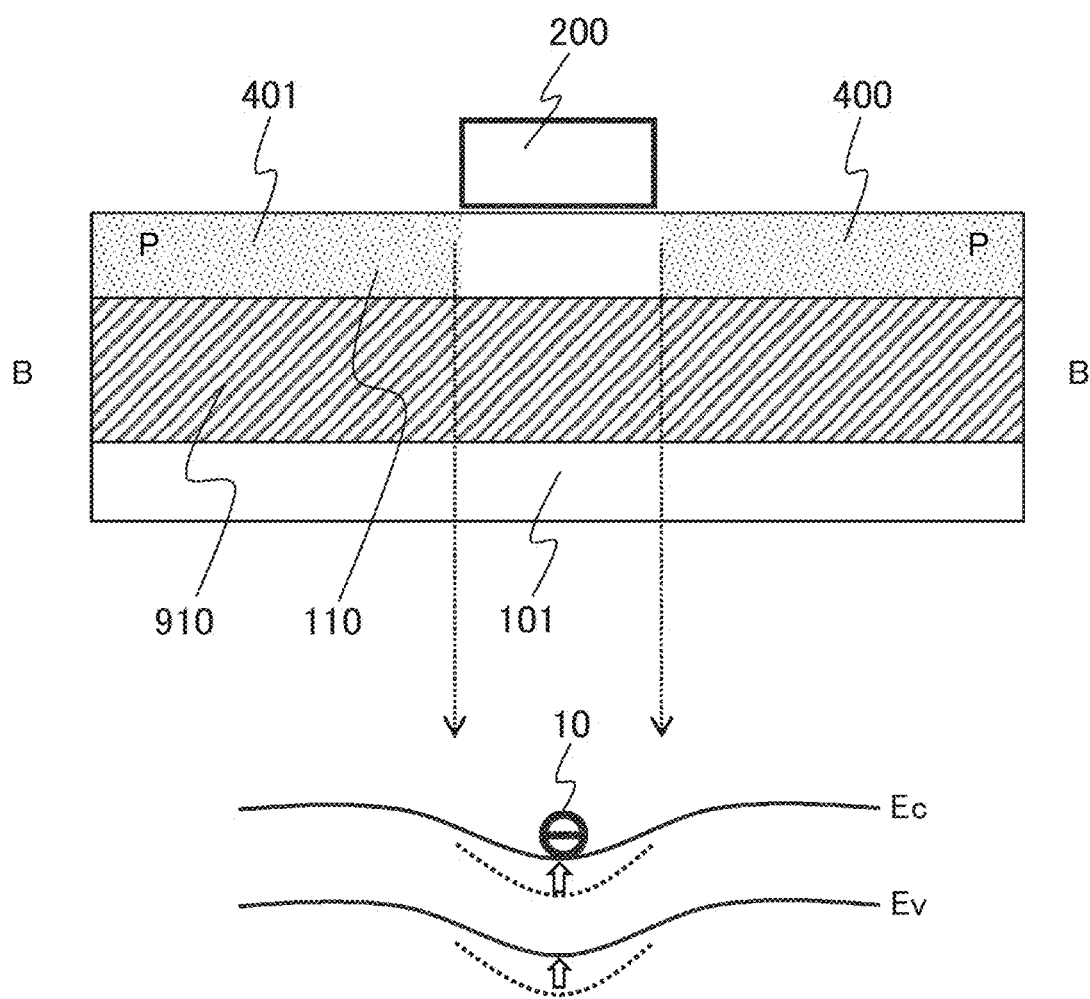
FIG. 12 is a sectional structure and potential diagram of the charge signal amplifying element.

A system of amplifying a charge signal by single to about two electrons obtained by spin-to-charge conversion to a current signal by multiple carriers in order to read the spin state of a semiconductor qubit using an electron spin will be described using FIGS. 9 to 15. An equivalent circuit diagram of FIG. 9 is shown in FIG. 10. A sectional structure (typical diagram) taken along line A-A of FIG. 9 is shown in FIG. 11. Further, a sectional structure (typical diagram) taken along line B-B thereof is shown in FIG. 12.

The element of the present embodiment is formed in a silicon layer of an SOI substrate in which a silicon oxide film 910 is formed on a silicon substrate 101. A silicon active region 110 has a T-shape, and includes an extension portion corresponding to a T-shaped vertical bar, which is provided with a diffusion layer electrode of a first conductivity type 300 at its tip. Three gates are arranged in parallel between the leading-end diffusion layer electrode 300 and its root (a connecting portion between the T-shaped vertical and horizontal bars) to form a MOS structure. These gates are the qubit gate QG and the barrier gates BG shown in FIG. 3 and are disposed so as to interpose the qubit gate QG between the barrier gates BG1 and BG2. Extension portions corresponding to the T-shaped horizontal bar are provided with diffusion layer electrodes 400 and 401 of a second conductivity type respectively, and a gate 200 is disposed at the connecting portion between the T-shaped vertical and horizontal bars, so that a current flowing between the diffusion layer electrode 400 and the diffusion layer electrode 401 is controlled. The gate 200 and the diffusion layer electrodes 400 and 401 constitute the charge signal amplifying element. The element arrangement of FIG. 9 includes MOS structures 60 for performing a spin-to-charge conversion operation and an amplifying element 50 for a read operation as shown in the equivalent circuit diagram (FIG. 10).

Figure 3:
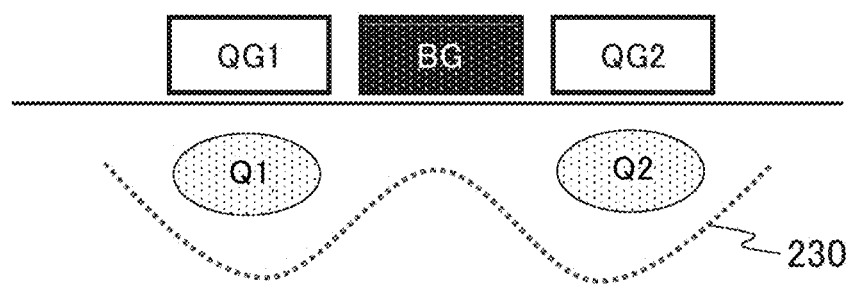
FIG. 3 is a diagram describing a two-qubit structure.
Figure 4:
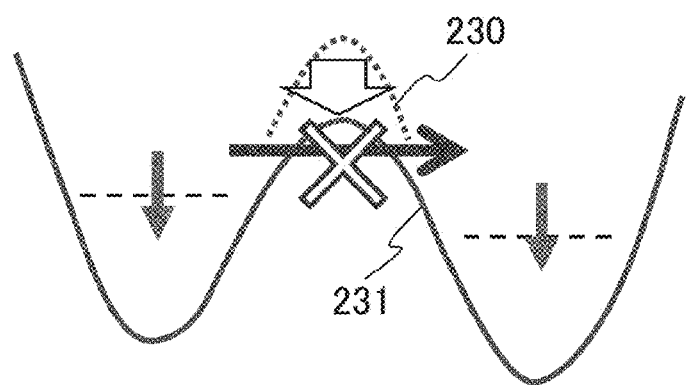
FIG. 4 is a diagram for describing spin-to-charge conversion.
Figure 5:
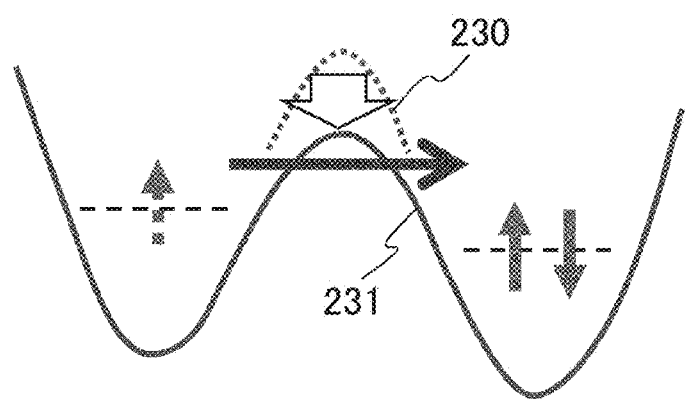
FIG. 5 is a diagram for describing spin-to-charge conversion.
Figure 6:
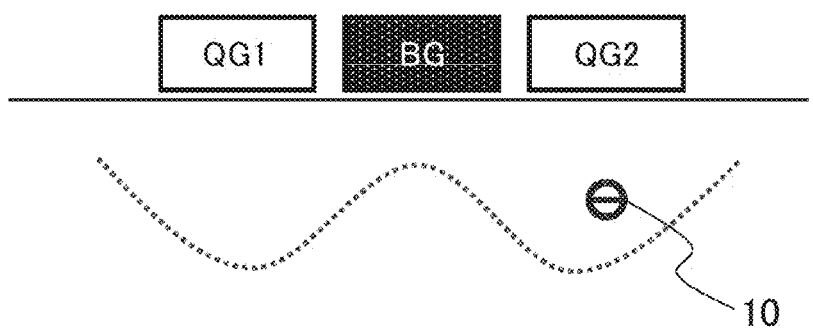
FIG. 6 is a diagram for describing spin-to-charge conversion.
Figure 7:
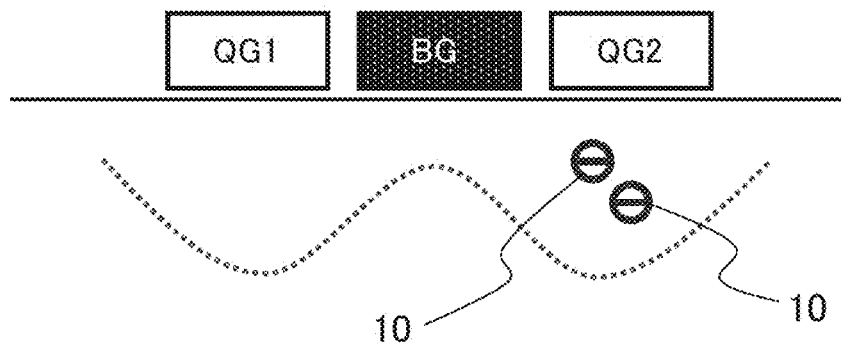
FIG. 7 is a diagram for describing spin-to-charge conversion.
Figure 8:
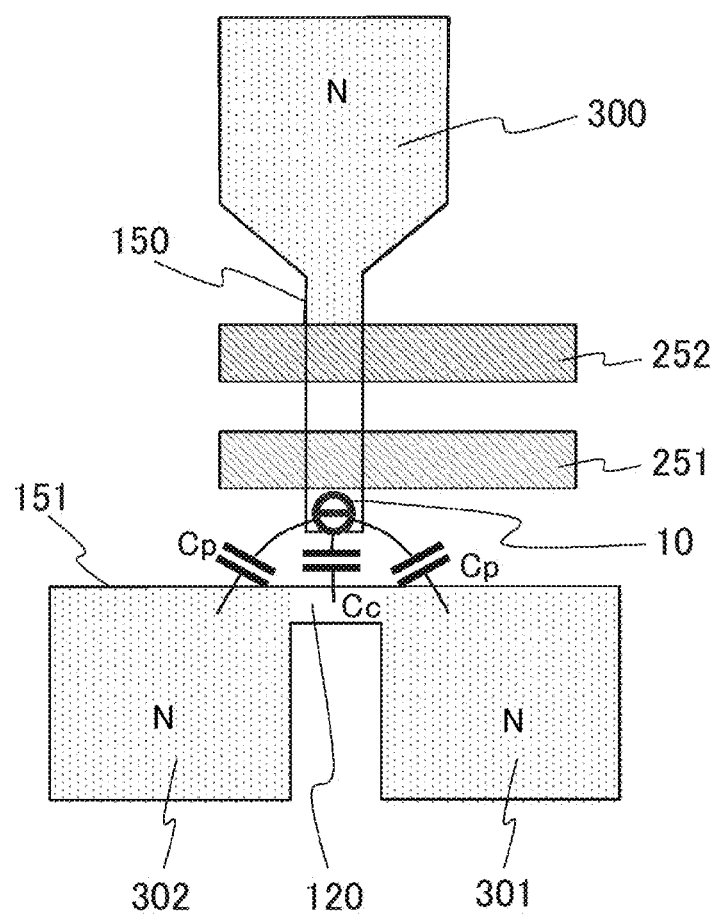
FIG. 8 is a planar arrangement diagram of an amplifying element using an amplifying function of a MOSFET.

A mechanism of reading the number of electrons (carriers) subjected to the spin-to-charge conversion operation will be described. Incidentally, here, in order to describe the basic configuration of the signal amplifying element, FIG. 9 shows an example in which as the minimum configuration, only one qubit gate QG is provided between the diffusion layer electrode 300 supplying the electrons to the qubit and the amplifying element 50, but a plurality of qubit gates QG can be provided in parallel as illustrated in FIG. 3. In this case, the amplifying element 50 amplifies a charge signal corresponding to the number of electrons (0 to multiple) under the qubit gate QG after execution of the known spin-to-charge conversion operation described in the background art.

In the A-A sectional diagram (FIG. 11), a potential for each electron near the boundary of the surface of the silicon active region 110 is shown in a band diagram using a valence band Ev and a conduction band Ec. A potential near the interface where each carrier moves will be expressed as "gate name" and "below" using the gate name when specifying the position. In general, the potential rises by applying a positive bias to the gate. However, in this example, since the carrier is an electron having a negative charge, an equipotential line is expressed to move downward in the potential diagram when the positive bias is applied to the gate.

The positive bias is applied to the gate 200, and the potential below the gate 200 is made higher than that below the qubit gate QG and the barrier gate BG1, so that an electron trapped under the qubit gate QG can be transferred under the gate 200. Although the figure shows the case where one electron is trapped under the qubit gate QG, the same operation can be performed even in the case of a plurality of electrons. The electron moves in the conduction band Ec as shown in the figure. At this time, since the electron has the negative charge under the gate 200, the potential after electron transfer shown by a solid line is lowered than the potential before electron transfer shown by a broken line. That is, with the trapping of the electron under the gate 200, the equipotential line is moved upward as indicated by an arrow. The potential under the gate 200 at this time is also shown in the B-B sectional diagram (FIG. 12). The potential diagram of FIG. 11 shows the potential in the direction along the T-shape vertical bar of the silicon active region 110, and the potential diagram of FIG. 12 shows the potential in the direction along the T-shaped horizontal bar of the silicon active region 110. Even in the potential diagram of FIG. 12, the equipotential line under the gate 200 changes upward with the transfer of each electron under the gate 200.

A current due to each positive hole 20, which flows where a potential gradient is given between the diffusion layer electrodes 400 and 401 in this potential state will be described using FIGS. 13, 14 and 15.

Figure 13:
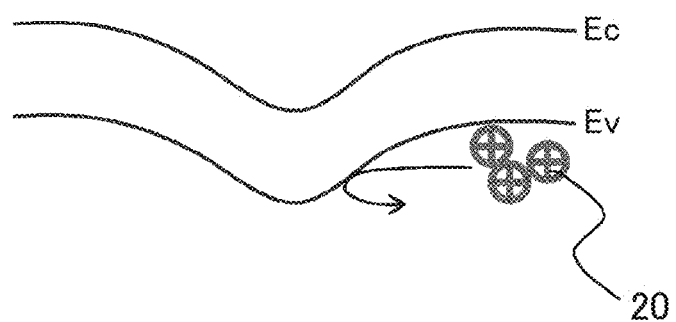
FIG. 13 is a potential diagram for describing the operation of the charge signal amplifying element.

FIG. 13 shows a case where there are no electrons under the gate 200. Since a barrier is formed against the positive hole 20 moving in the valence band Ev due to the electric field effect of the gate 200, the current between the diffusion layer electrodes 400 and 401 is blocked.

Figure 14:
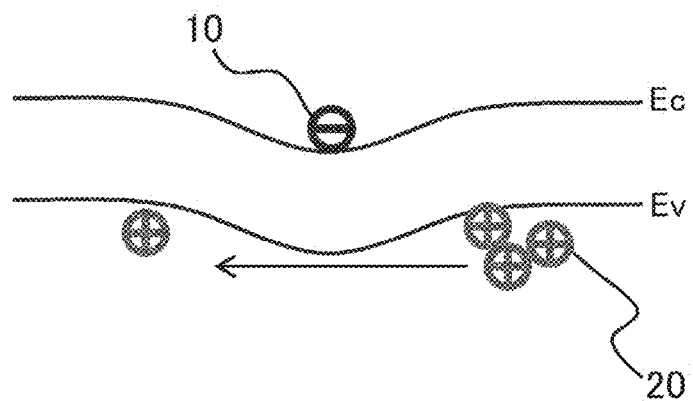
FIG. 14 is a potential diagram for describing the operation of the charge signal amplifying element.

FIG. 14 shows a case where one electron is introduced under the gate 200. Even if the same bias as in FIG. 13 is applied to the gate 200, the potential barrier to the positive hole 20 is reduced as compared with the case of FIG. 13 due to the existence of an electron 10. Therefore, the positive hole 20 beyond the barrier exists and hence the current flows between the diffusion layer electrodes 400 and 401.

Figure 15:
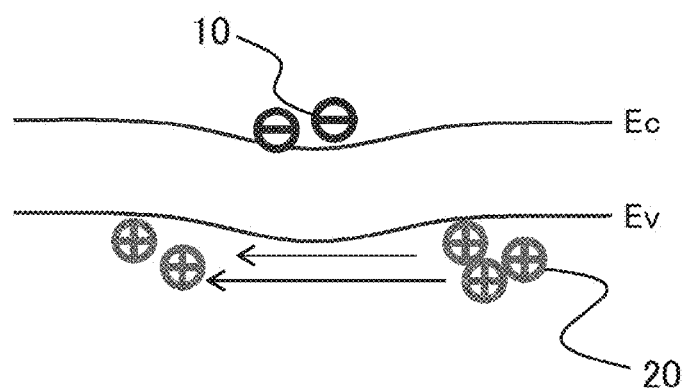
FIG. 15 is a potential diagram for describing the operation of the charge signal amplifying element.

FIG. 15 shows a case where two electrons are introduced under the gate 200. Even if the same bias as in FIG. 13 is applied to the gate 200, the potential barrier to the positive hole 20 is further reduced as compared to FIG. 14 due to the negative charges of the two electrons 10, so that more hole current occurs between the diffusion layer electrodes 400 and 401.

A large charge signal can be obtained by making the hole current flow for the required time. That is, the difference (0 to multiple) in the number of electrons, which occurs due to the spin-to-charge conversion can be output by this function as a large difference in the amount of current. By checking a hole current value under a predetermined gate bias condition in advance, it is possible to detect the number of electrons trapped under the gate 200 from the hole current value.

Incidentally, when observing the hole current, as indicated by a dashed line in the potential diagram of FIG. 11 in regard to the potential in the direction along the T-shaped vertical bar of the silicon active region 110, the application of the bias to the qubit gate QG1 and the barrier gate BG1 is held so that the potential under the qubit gate QG>the potential under the barrier gate BG1. This is from the following reason. In order to hold the electron under the gate 200, the application of the bias to the gate 200 and the barrier gate BG1 is required to be held such that the potential under the gate 200>the potential under the barrier gate BG1. This means that the hole current tends to flow in the direction of the barrier gate BG1. The potential under the qubit gate QG is made higher than the potential under the barrier gate BG1, thereby making it possible to prevent the hole current from flowing in the direction along the T-shaped vertical bar of the silicon active region 110.

After observing the current, a high potential is applied to the diffusion layer electrode 400 (source side) to recombine the electron and the positive hole trapped under the gate 200 to eliminate them, thereby enabling returning to an initial state. Alternatively, the bias potentials to the barrier gate BG1, the qubit gate QG, and the barrier gate BG2 are sequentially manipulated to thereby allow the diffusion layer electrode 300 to absorb each electron trapped under the gate 200, whereby the returning to the initial state may be taken.

In FIG. 9, the diffusion layer electrodes are arranged on both sides of the gate 200 in the amplifying element 50, whereas a gate electrode may be interposed between the diffusion layer electrode and the gate 200. An element arrangement and an equivalent circuit diagram in this case are respectively shown in FIGS. 16 and 17. In the case of the configuration of FIG. 9, there is a risk that since there are many positive holes exist in the diffusion layer electrodes 400 and 401, the distance between each trapped electron and the positive hole becomes shorter when the gate 200 becomes small, and the probability of disappearance due to the recombination is increased, so that it becomes hard to obtain a sufficient current. On the other hand, in an amplifying element 51 of FIG. 16, a sufficient distance can be ensured between each electron trapped under a gate 200 and diffusion layer electrodes 400 and 401 by interposing gates 261 and 262, thereby making it possible to trap the electron for a long time. When observing the hole current, the bias condition for the gates 261 and 262, barrier gate BG1, and qubit gate QG is set and measured in such a manner that the hole current flowing between the diffusion layer electrodes 400 and 401 is effectively controlled according to the number of the electrons under the gate 200.

Figure 16:
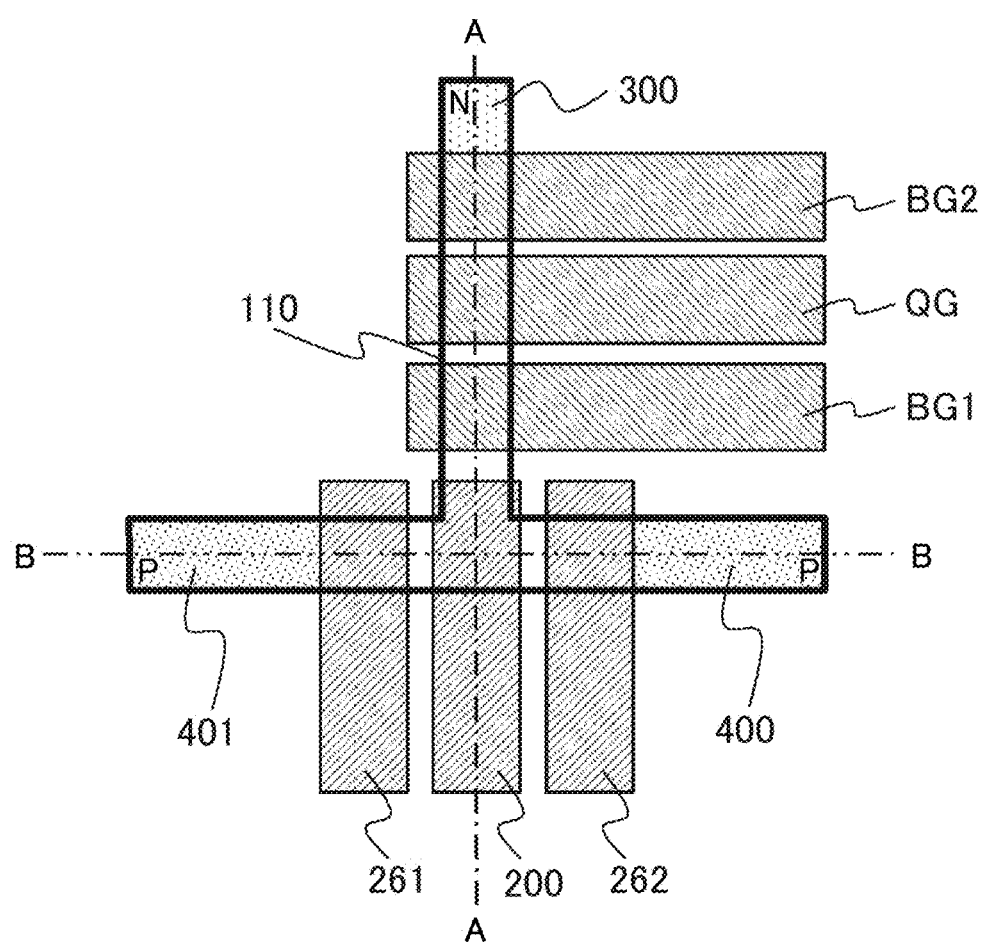
FIG. 16 is a planar arrangement diagram of a charge signal amplifying element.
Figure 17:
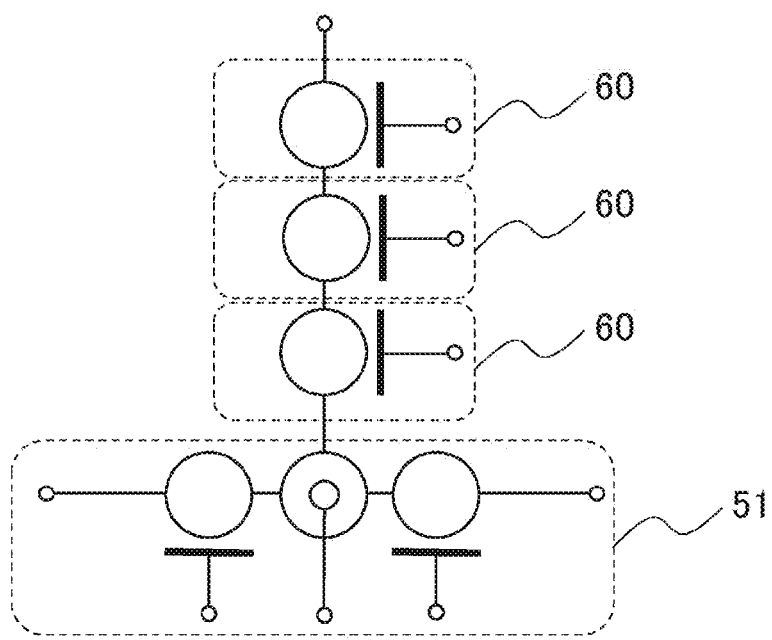
FIG. 17 is an equivalent circuit diagram corresponding to FIG. 16.

As an example of the charge signal amplifying element for qubit readout applications, there has been shown in each of FIGS. 9 and 16, the configuration in which the polarity of the diffusion layer electrode 300 is set to an N type and the polarities of the diffusion layer electrodes 400 and 401 are set to a P type to thereby trap each electron under the gate 200 to be read as the hole current, but the general charge signal amplifying element can also be configured to trap the positive hole to the valence band Ev and read it as the current due to each electron flowing in the conduction band Ec. In this case, the charge signal amplifying element can be similarly operated by swapping the polarities of the diffusion layer electrode 300 and the diffusion layer electrodes 400 and 401 and swapping the sign of the bias applied to each gate.

Thus, in the signal amplifying element of the present embodiment, the elementary charge to be the input signal is directly trapped to the channel of a MOSFET, and a channel potential change due to its self-electric field is measured as a change in the characteristic of the current flowing through the channel. When using the electron as the elementary charge to be trapped, the positive hole is used as the carrier for the current to be read. On the other hand, when the positive hole is used as the elementary charge to be trapped, the electron is used as the current carrier.

When the same carrier is used for the charge carrier to be trapped and the current carrier to flow through the channel, trapped charge information is destroyed by the flowing current. On the other hand, with the use of different carriers, the trapped charge information is not destroyed by the current carrier flowing through the channel. For example, when the electron is used for trap, and the positive hole is used as the current to flow, the electron is trapped to the conduction band Ec, and hence the charge information is not destroyed by the positive hole flowing in the valence band Ev.

The electron in the conduction band Ec disappears over time by recombination reaction, but a long time can be secured until recombination in a cryogenic environment. This is therefore particularly effective for the semiconductor device operated at low temperature.

Second Embodiment (Qubit Array 1)

Figure 18:
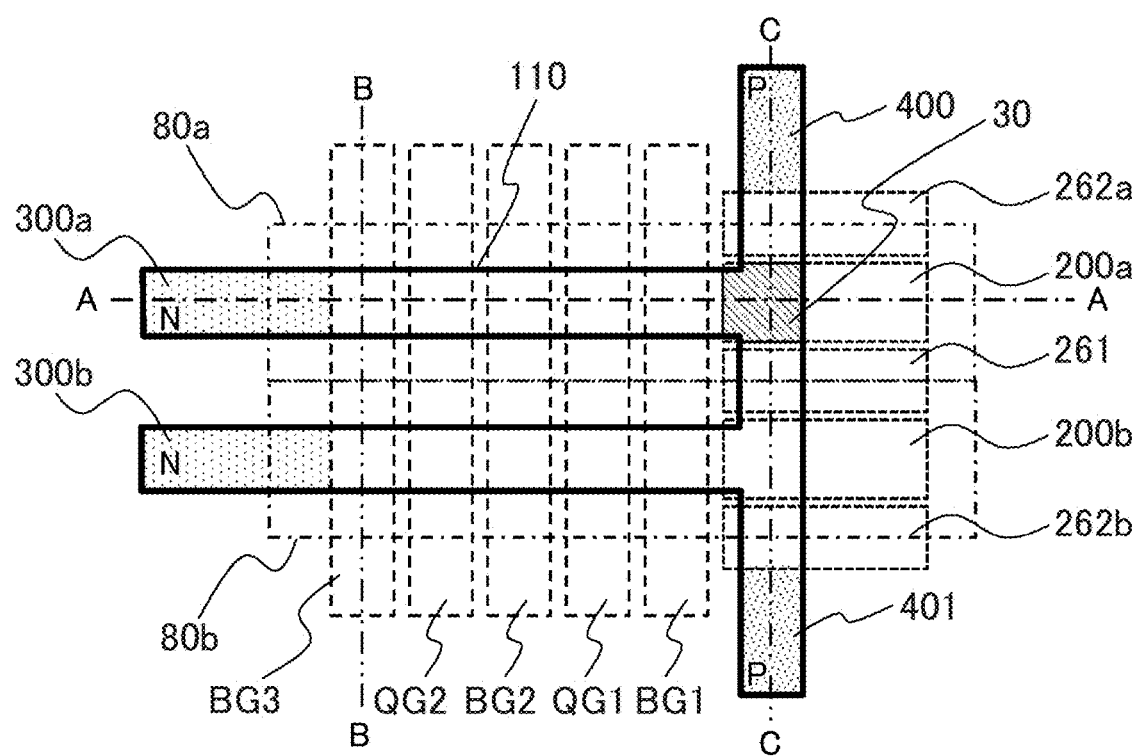
FIG. 18 is a planar arrangement diagram of a qubit array mounted with a charge signal amplifying element.
Figure 19:
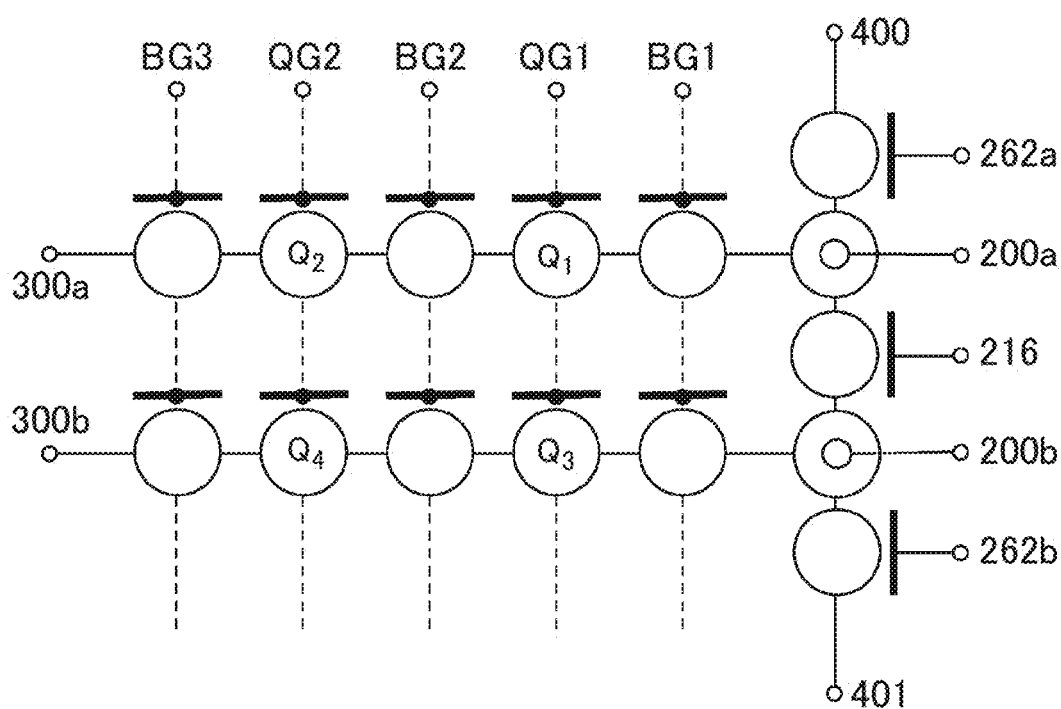
FIG. 19 is an equivalent circuit diagram corresponding to FIG. 18.

An amplifying element of the present embodiment is effective for reading of spin information on array-disposed qubits. There is shown in FIG. 18, an example in which an amplifying element is arranged for qubits array-disposed with the structure of FIG. 16 as the base. There is shown here, an example in which cells 80 each indicated by a dashed line frame being a basic layout are arranged vertically in parallel. A silicon active region 110 has a comb shape in which a plurality of T-shaped vertical bars are arranged in parallel. Extension portions each corresponding to the T-shaped vertical bar are respectively provided with diffusion layer electrodes 300 of a first conductivity type at their tips. Five gates, a barrier gate BG3, a qubit gate QG2, a barrier gate BG2, a qubit gate QG1, and a barrier gate BG1 are disposed to straddle between the leading-end diffusion layer electrode 300 and the root (connecting portion of T-shaped vertical and horizontal bars). An amplifying element region in the basic cell 80a is designated at 30. An equivalent circuit diagram corresponding to the layout of FIG. 18 is shown in FIG. 19. A MOS element operated as a qubit and a gate-operated MOS element which controls between qubits are arranged alternately. In FIG. 19, the MOS elements operated as the qubits are shown with a mark of "Q".

Figure 20:
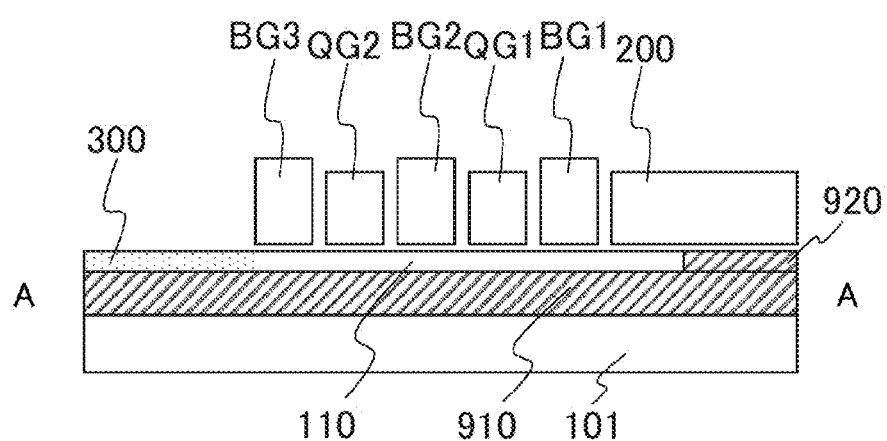
FIG. 20 is a sectional structure diagram of the qubit array.
Figure 21:
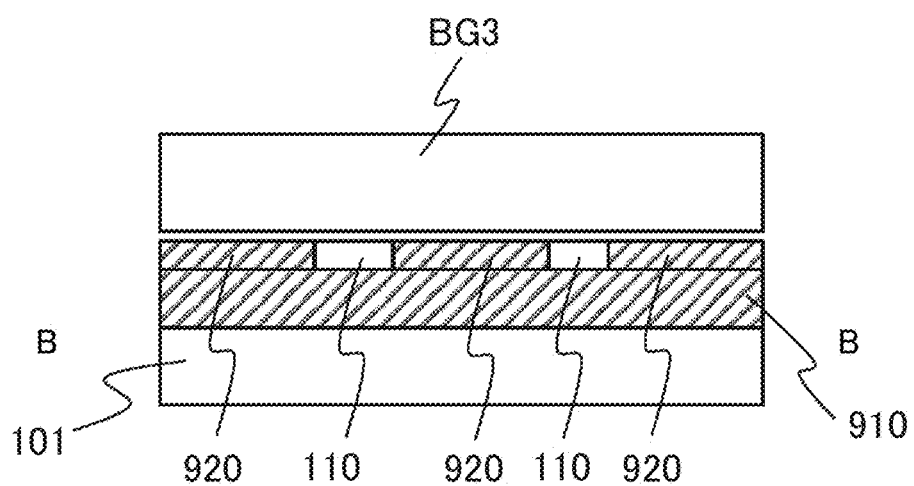
FIG. 21 is a sectional structure diagram of the qubit array.
Figure 22:
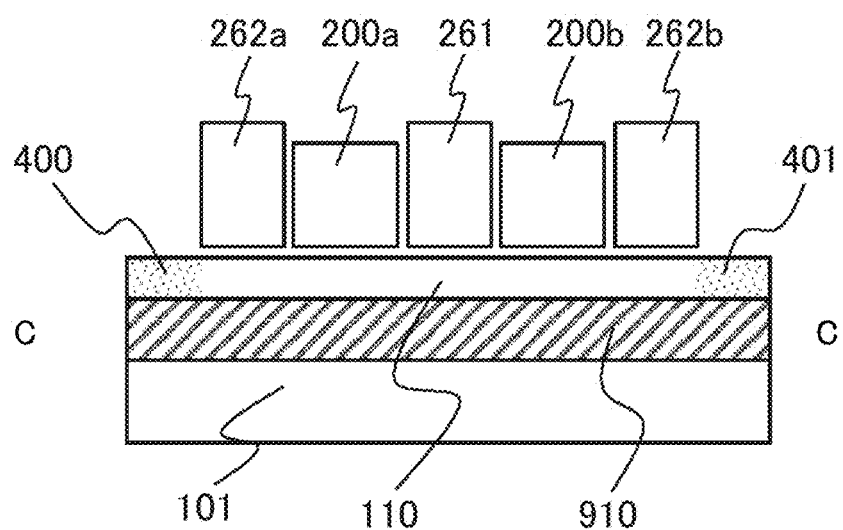
FIG. 22 is a sectional structure diagram of the qubit array.
Figure 23:
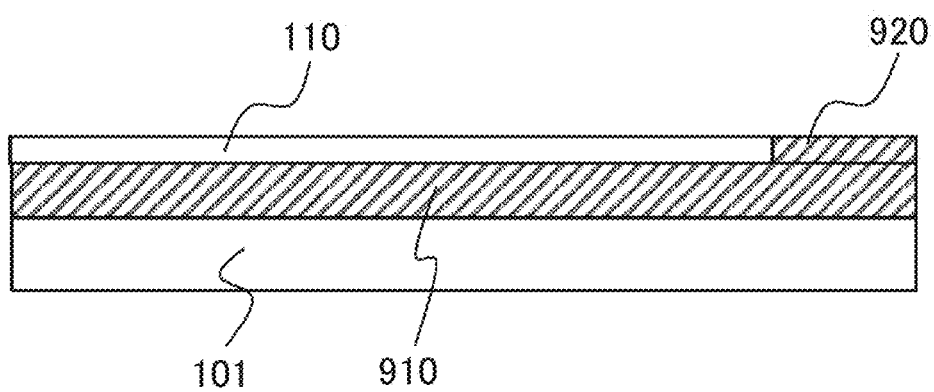
FIG. 23 is a diagram describing a manufacturing process of a qubit array.

An A-A sectional structure (typical diagram) of FIG. 18 is shown in FIG. 20, a B-B sectional structure (typical diagram) of FIG. 18 is shown in FIG. 21, and a C-C sectional structure (typical diagram) of FIG. 18 is shown in FIG. 22. The structure of FIG. 16 is integrated by repeatedly arranging the basic cells 80.

A process for manufacturing a qubit array will be described with reference to FIGS. 23 to 28. Here, the formation states of the element in the A-A section of FIG. 18 are shown for each process.

The device is formed on an SOI substrate having a monocrystal silicon layer 110 on a silicon oxide film 910 formed on a silicon substrate 101. The silicon active region 110 is patterned on an SOI layer having a thickness of 40 nm. The silicon active region 110 and an element isolation region 920 are planarized by the known method using CMP (Chemical Mechanical Polishing) called an STI (Shallow Trench Isolation) process (refer to FIG. 23).

Then, the surface of the SOI layer is thermally oxidized to form a gate insulating film 901 having a thickness of 4 nm. A large amount of impurities are doped on the gate insulating film 901 to deposit metallized polycrystalline silicon 220 by 60 nm and further deposit a silicon oxide film 960 by 100 nm. The laminated film formed by the above processes is subjected to gate patterning with a width of 50 nm on a pitch of 100 nm to foam a gate (barrier gate BG). Further, an impurity diffusion layer 300 is famed in the silicon active region 110 by an ion implantation method. Although not shown in the figure, impurity diffusion layers 400 and 401 are also famed in the same manner (refer to FIG. 24).

Figure 26:
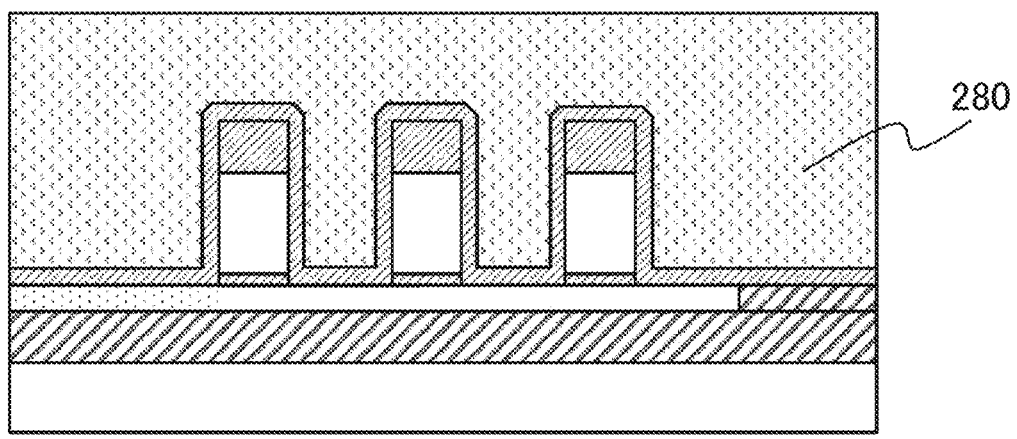
FIG. 26 is a diagram describing the manufacturing process of the qubit array.
Figure 27:
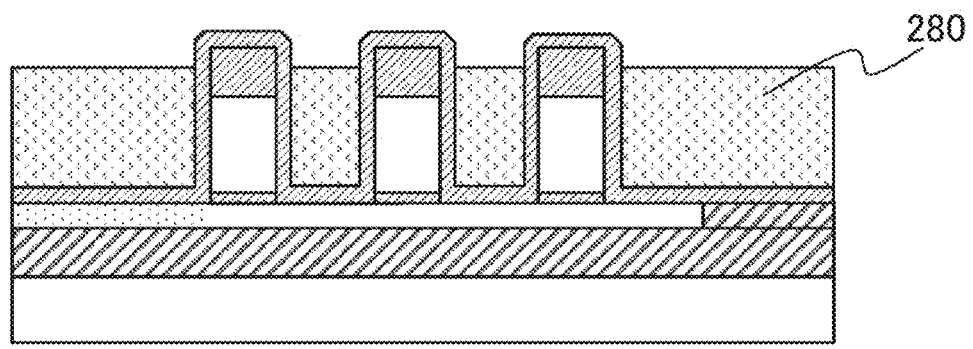
FIG. 27 is a diagram describing the manufacturing process of the qubit array.
Figure 28:
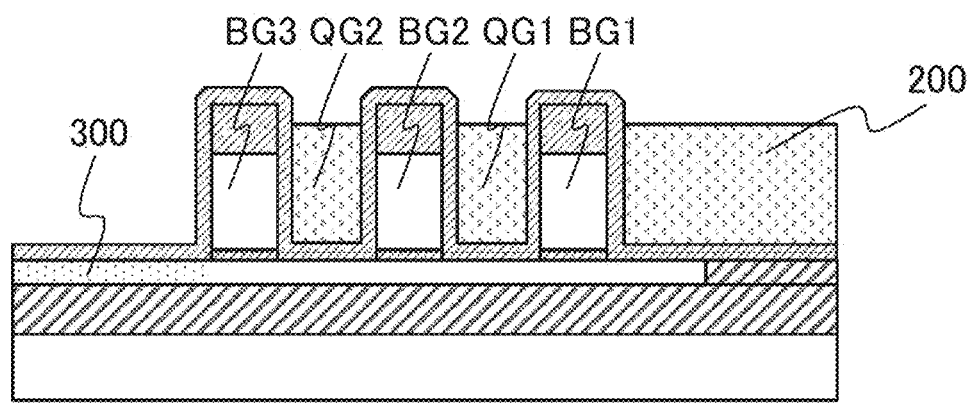
FIG. 28 is a diagram describing the manufacturing process of the qubit array.

Thereafter, a silicon oxide film 970 is deposited 15 nm (refer to FIG. 25), and polycrystalline silicon 280 doped with an impurity in high concentration is deposited and its surface is planarized (refer to FIG. 26). The polycrystalline silicon 280 is anisotropically etched back to expose gate pattern upper portions each corresponding to the barrier gate BG, so that the gate 200 and the qubit gate QG of the amplifying element are separated (refer to FIG. 27). Then, the unnecessary polycrystalline silicon 280 (polycrystalline silicon 280 on the impurity diffusion layer 300) is removed (refer to FIG. 28).

Since the diffusion layer electrode and the gate electrode are famed by the above processes, an interlayer insulating film is deposited, and a contact hole is opened on each electrode to perform metal wiring. Since these processes are the same as a normal wiring process for LSI, the description thereof will be omitted. Thus, a quantum computer chip equipped with qubits can be manufactured by the manufacturing process.

Figure 24:
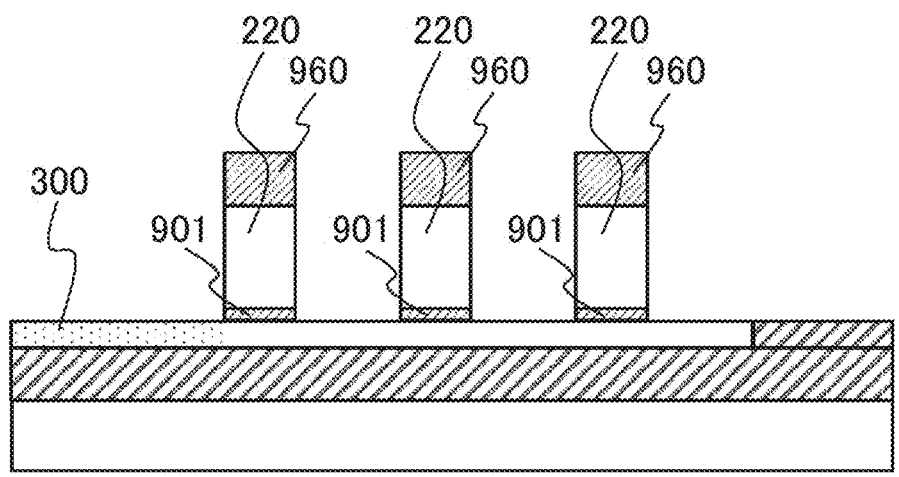
FIG. 24 is a diagram describing the manufacturing process of the qubit array.
Figure 25:
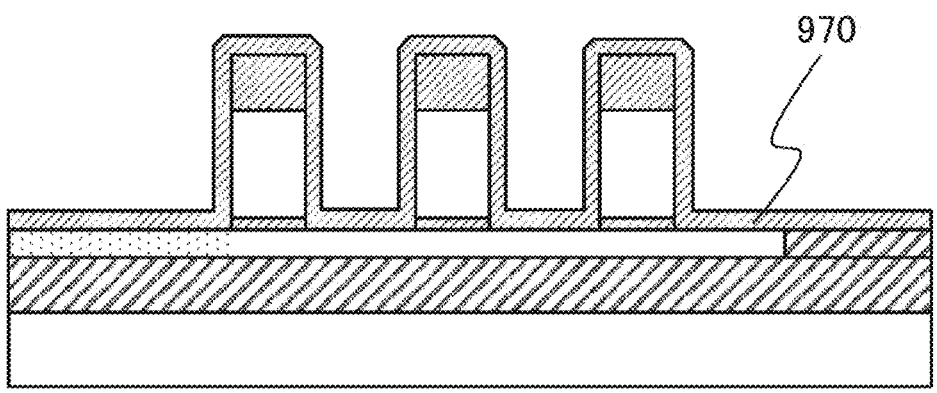
FIG. 25 is a diagram describing the manufacturing process of the qubit array.

The method of forming the barrier gate BG and the diffusion layer electrode 300 shown in FIG. 24 is the same as that of the conventional CMOS device. Therefore, it is possible to fabricate a practical chip in which a qubit and its peripheral circuits are mixed, by manufacturing a peripheral circuit device required around the qubit at the same time as these gates are formed. In general, in the MOSEET, a threshold value when turning a channel current ON and OFF has been set depending on the concentration of an impurity doping the channel. However, since the activation of the doped channel impurity depends on the temperature, the channel impurity does not sufficiently function and the setting of the threshold value becomes difficult where as in the quantum computer chip, it is used at low temperature.

Thus, in the MOSEET used at the cryogenic temperature, it is useful to set the channel as a so-called intrinsic channel low in impurity concentration and control the threshold value by a work function of a gate material. In the case of the so-called intrinsic channel low in channel impurity, the threshold value can be uniquely determined by the work function of the gate material in an ideal state where there is no influence of interface traps, etc.

Specifically, in the peripheral circuit for the qubit used in the quantum computer shown in the present embodiment, for example, a polycrystalline silicon gate doped with a P-type impurity in high concentration is used for NMOS, and a polycrystalline silicon gate doped with an N-type impurity is used for PMOS. Consequently, this is useful in designing a CMOS circuit because it is possible to obtain a stable threshold value even at the very low temperature. Thus, it is possible to realize the qubit and its peripheral circuit by using the already established processing technology. Although there is shown here the example in which the polycrystalline silicon is used as the gate material, a material having a work function that becomes a required threshold value, e.g., a metal material can be used for the gate. Further, it is also useful to use a material (silicon nitride film, hafnium oxide film, zirconium oxide film or the like) having a fixed charge or a dipole structure as a gate insulating film.

The operation of reading the arrayed qubits shown in FIG. 18 will be described. As an example, assume that an arithmetic operation and a spin-to-charge conversion operation in a qubit array are completed, and each electron desired to be read is trapped in a qubit Q1 (under qubit gate line QG1) at an active-region upper stage (basic cell 80*a*) where a diffusion layer electrode 300*a* exists. A bias for the barrier gate line BG1 and gate 200*a* is controlled to thereby transfer the electron trapped in the qubit Q1 to the amplifying element region 30 (under the gate 200*a*). After the charge transfer, a strong gate bias is applied to gates 200*b* and 262*b* to induce a channel, and a hole current is made to flow between the diffusion layer electrodes 400 and 401, thereby making it possible to read the number of the electrons trapped under the gate 200*a*. After its reading, each electron trapped under the gate 200*a* is made to be extinguished (reset). Subsequently, reading is performed on an active-region lower stage (basic cell 80*b*) where a diffusion layer electrode 300*b* exists. In order to sequentially perform the operation of reading the qubits arranged in the array form, the string of the qubits to be read for each basic cell 80 is set to be displaced when the arithmetic operation and the spin-to-charge conversion operation in the qubit array are ended. Specifically, in the arithmetic operation and the spin-to-charge conversion operation that precede the read operation in the qubit array, the result of their operation may be set such that the string of the qubits of the basic cell 80 to be read first becomes closer to the amplifying element region than the string of qubits of the basic cell 80 to be read later. In the example of FIG. 18 (19), the electrons to be read with the strings being displaced are trapped in the qubit Q1 at the upper stage and the qubit Q4 at the lower stage. With this, it is possible to repeat that the electrons trapped in the same direction (right direction) at the respective stages are transferred by using the gate lines straddling the basic cell, and the electrodes are sequentially read as the current between the diffusion layer electrodes 400 and 401.

Figure 29:
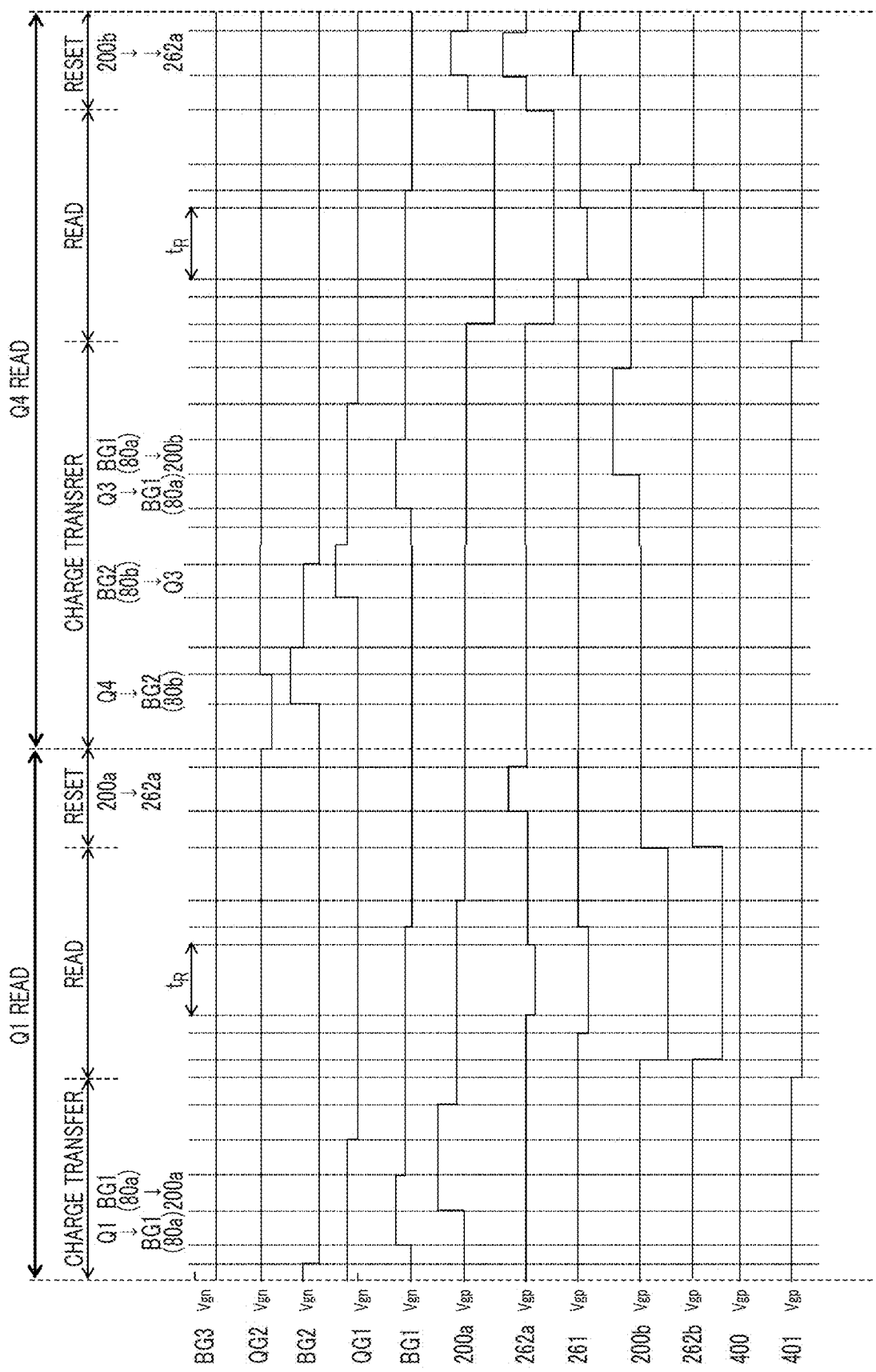
FIG. 29 is a time chart of a read operation.

A time chart for reading of the qubit array of FIG. 18 described above is shown in FIG. 29. In the present time chart, examples of bias application to the respective electrodes for the read operation are collectively shown in time series. Each waveform indicates an applied voltage. In the qubit-system gate line (gate line BG, QG), a ground potential Vgn of the N-type diffusion layer electrode 300 is expressed as a reference, and in the read-system gate line (gate line 200, 261, 262), a ground potential Vgp of the P-type diffusion layer electrode 400 (401) is expressed as a reference. As described above, since the threshold value of MOSFET is determined depending on the gate electrode material, it is effective to set the appropriate ground potential Vgn and ground potential Vgp. Here, since the applied bias is shown instead of the electron potential, the positive potential is taken in the upper direction and expressed as the difference from the reference ground potential (Vgn or Vgp).

In the first half of the time chart, the electric charge of the qubit Q1 in the basic cell 80*a* is transferred under the gate 200*a* for reading, and in the second half of the time chart, the electric charge of the qubit Q4 in the basic cell 80*a* is transferred under the gate 200*b* for reading. The reading of each basic cell 80 includes the processes of charge transfer, reading, and resetting. In the charge transfer process, an electronic transfer source and destination are represented like Q1→BG1(80*a*). The notation BG1(80*a*) means under the intersection of the gate line BG1 and the silicon active region 110 in the basic cell 80*a* in FIG. 18. In the first half of the time chart, such bias application as to turn off the MOSFET famed by the barrier gate BG2 adjacent to the qubit Q1 is performed to thereby prevent the influence on the qubit of each stage arranged in the string on the side of the diffusion layer electrode 300*a* from the string where the qubit Q1 is disposed.

Further, the sequence transferred for each gate is used in this example, but when the amount of charge to be read is large, the bridging gate is made to serve as a normal pass gate, and the charge between bits lying on both sides thereof can also be transferred.

At a period $t_R$ in the read process, a read current can be obtained. It is possible to directly read a current value or integrate a current value during this period to thereby read it as the amount of charge. Since the reading methods of these are the known technologies, their detailed description will be omitted here.

(Qubit Array 2)

Figure 30:
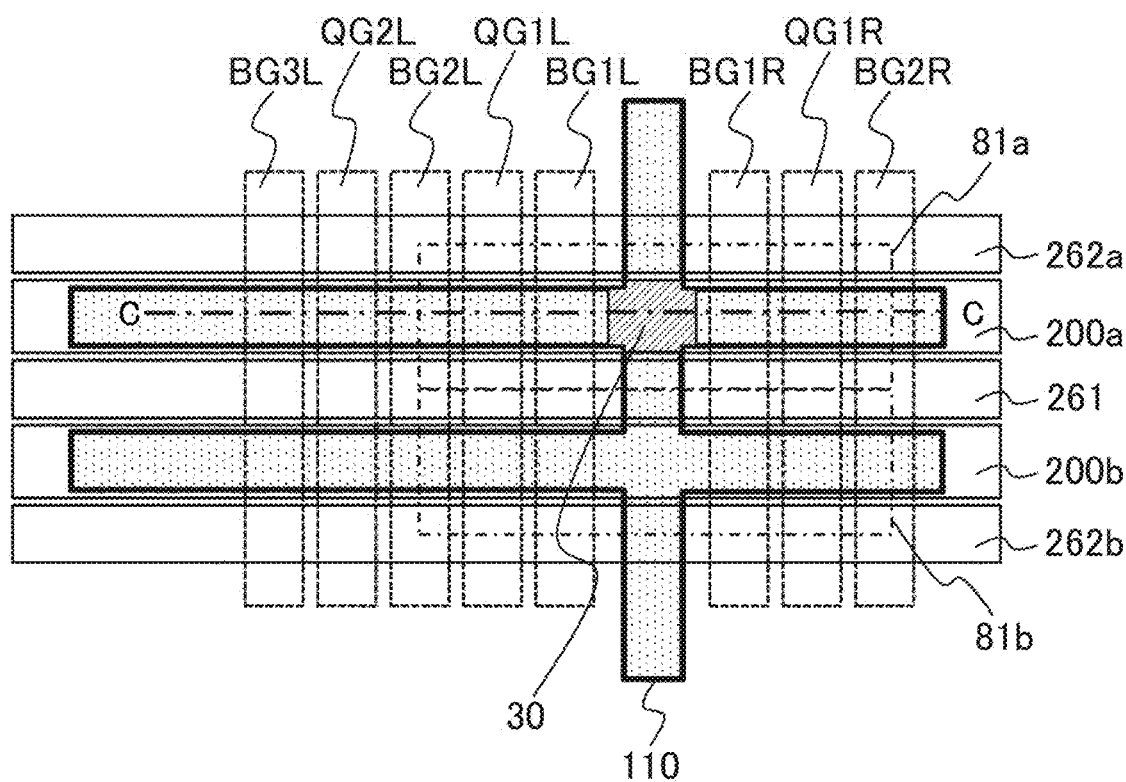
FIG. 30 is a planar arrangement diagram of a qubit array.
Figure 31:
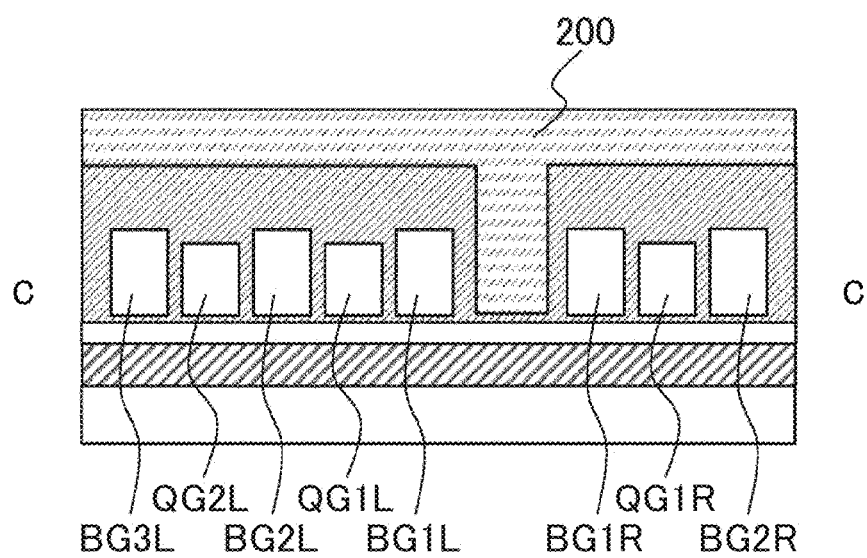
FIG. 31 is a sectional structure diagram of the qubit array.
Figure 32:
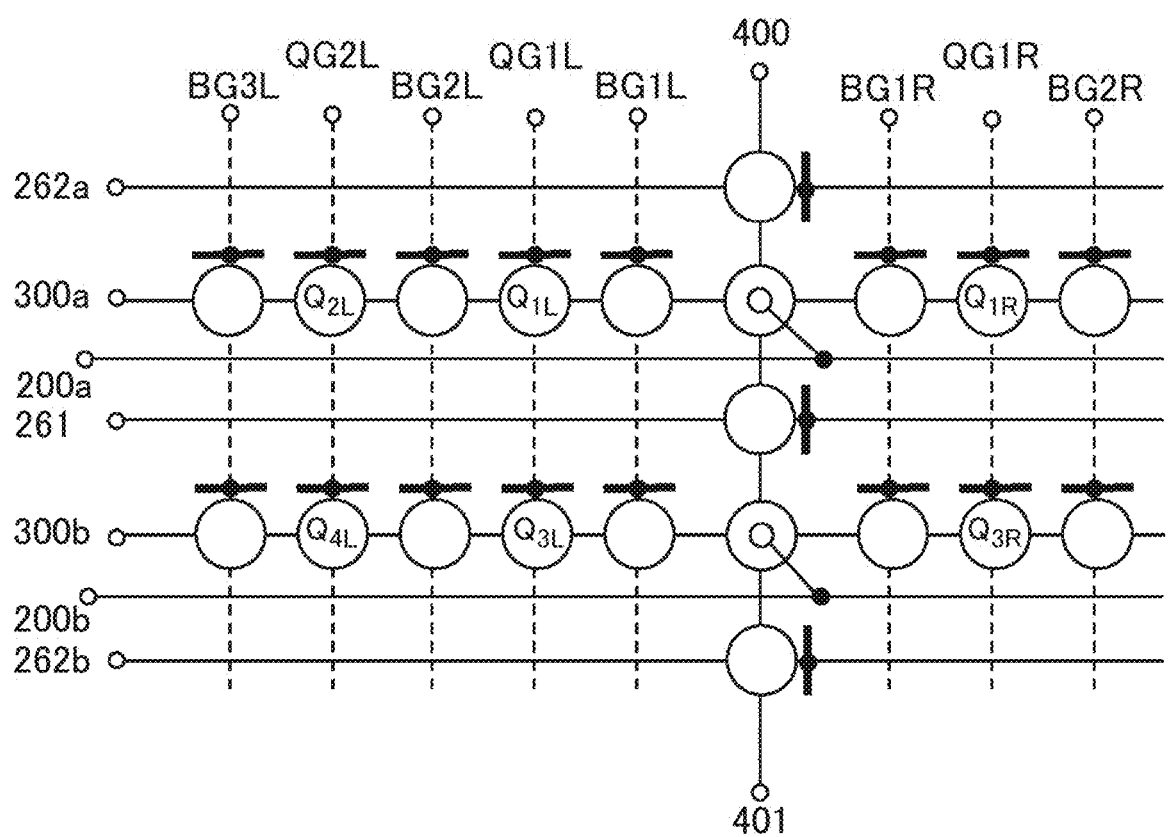
FIG. 32 is an equivalent circuit diagram corresponding to FIG. 30.

In the qubit array shown in FIG. 18, the signal amplifying element of the first embodiment is disposed at the array end, the result of arithmetic processing is sequentially transferred into the array, and the charge signal is read at the array end. FIGS. 30 to 32 show an example of a qubit array in which the signal amplifying element of the first embodiment is disposed in the array. FIG. 30 is a planar arrangement diagram, FIG. 31 is a C-C sectional structure diagram (typical diagram) of FIG. 30, and FIG. 32 is an equivalent circuit diagram corresponding to the layout of FIG. 30. Although not demonstrated in the layout diagram, as shown in the equivalent circuit diagram, an N-type diffusion layer electrode is famed at the end of a portion extending in the horizontal direction of a silicon active region 110, and P-type diffusion layer electrodes are famed at both ends of a portion extending in the vertical direction. The same applies to the following qubit arrays.

FIG. 30 shows an example in which two signal amplifying elements are arranged in the upper and lower two qubit strings. Although the upper and lower two strings are shown here, the qubit array can be developed into the qubit array of the required size by arranging each basic cell 81 to be folded. When the basic cells 81 are folded and arranged in both vertical and horizontal directions, the silicon active region 110 becomes a grid form, and hence the intersection of a portion extending in the vertical direction of the silicon active region 110 and a portion extending in the horizontal direction thereof becomes each amplifying element region. In FIG. 30, the amplifying element region of the basic cell 81a is shown as the amplifying element region 30. As the feature of the device structure of FIG. 30, as shown in the sectional diagram of FIG. 31, gate lines 200, 261, and 262 used for each signal amplifying element are formed above gate lines BG and QG to control qubits in such a manner that the extension direction of the gate lines 200, 261, and 262 is orthogonal to the extension direction of the gate lines BG and QG.

A qubit read operation is also similar to that in the case of the qubit array shown in FIG. 18. However, since the qubits exist both sides of the amplifying element region in the layout of FIG. 30, it is necessary to block the interaction of the qubit to read with the qubit located on the opposite side with the amplifying element region interposed therebetween. Therefore, for example, when a qubit Q1L in FIG. 32 is read, a bias is applied to gate lines BG1R and QG1R to create a potential barrier to carriers. Thus, the read operation similar to that in the qubit array shown in FIG. 18 can be performed.

(Qubit Array 3)

Figure 33:
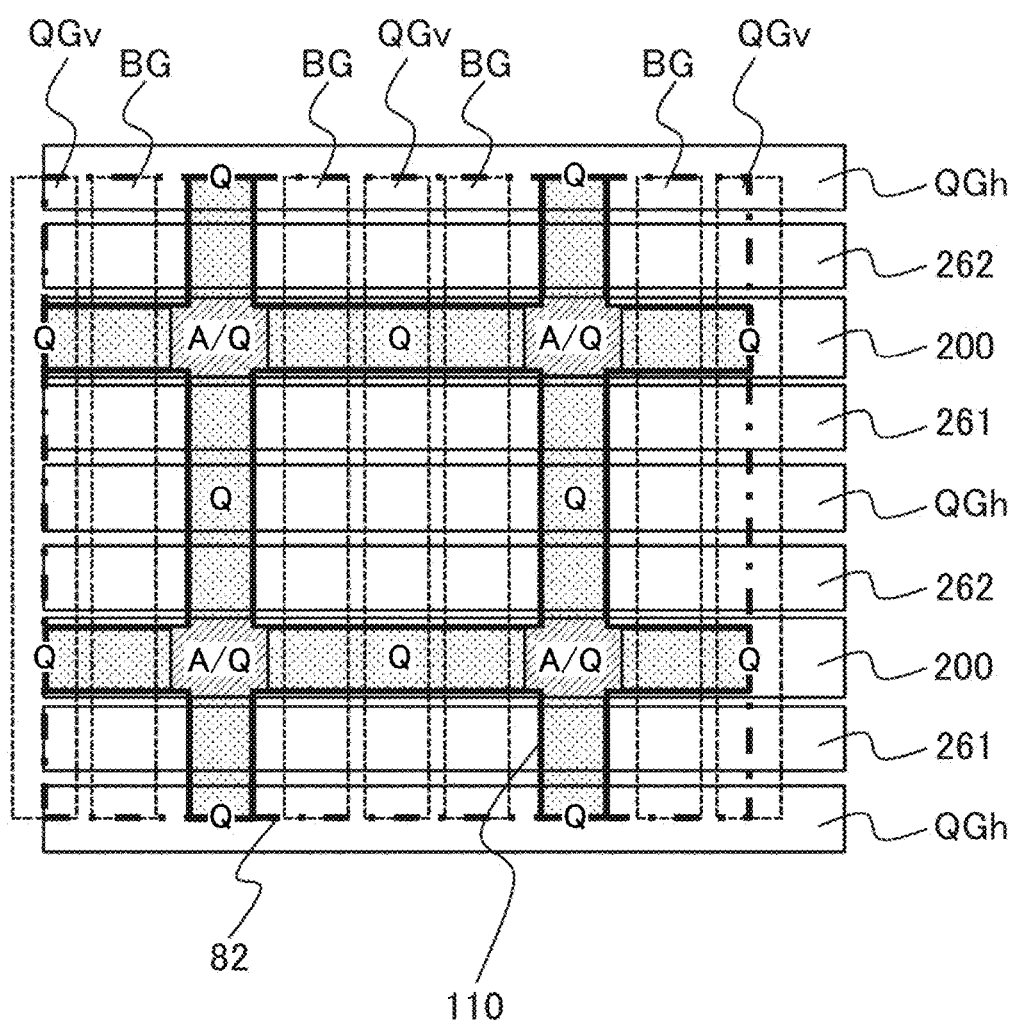
FIG. 33 is a planar arrangement diagram of a qubit array.
Figure 34:
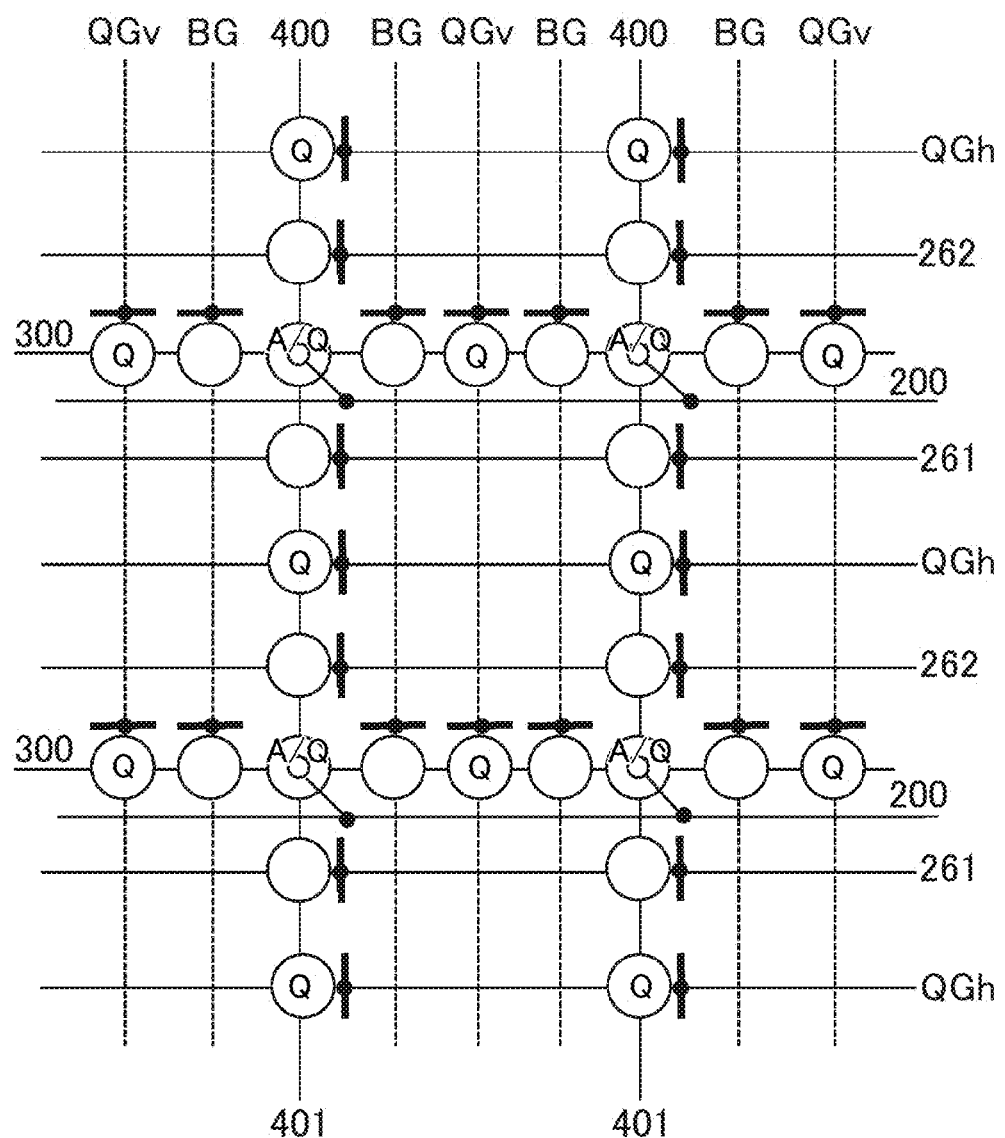
FIG. 34 is an equivalent circuit diagram corresponding to FIG. 33.

The signal amplifying element of the first embodiment is basically a MOS structure and is the same as the structure of the qubit. Therefore, the signal amplifying element may be utilized as the qubit in the qubit array. FIGS. 33 and 34 show an example of an array in which a MOS structure in a signal amplifying region is also used as the qubit. FIG. 33 is a planar arrangement diagram, and FIG. 34 is an equivalent circuit diagram corresponding to a layout of FIG. 33. Since a MOS structure of an intersection of a grid-shaped silicon active region 110 serves as the signal amplifying element and the qubit, it is represented as a code "A/Q". Even in the array structure, gate lines 200, 261, and 262 are formed above gate lines BG and QG to control each qubit in such a manner that the extension direction of the gate lines 200, 261, and 262 and the extension direction of the gate lines BG and QG are orthogonal to each other. Further, in the example of FIG. 33, the qubits are provided even on the silicon active region 110 extending in the vertical direction of the drawing. These qubits are connected to each other by a gate line QGh provided in the same layer as and parallel to the gate lines 200, 261, and 262 used for the signal amplifying element. Therefore, the MOS structure constituted by the gate lines 261 and 262 is used for the signal amplifying element in the read operation of the qubit array, but used as a barrier gate in the arithmetic operation and the spin-to-charge conversion operation.

Figure 35:
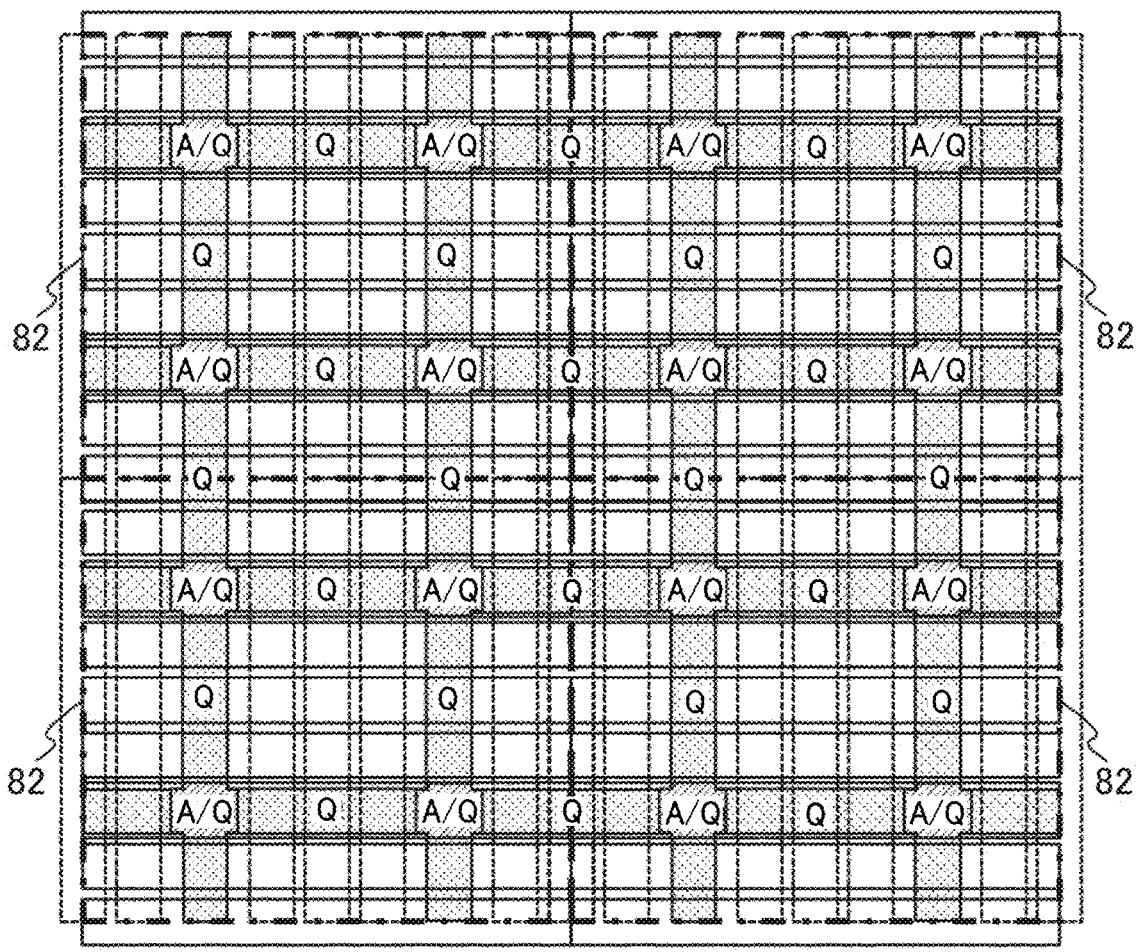
FIG. 35 is a planar arrangement diagram of a qubit array.
Figure 36:
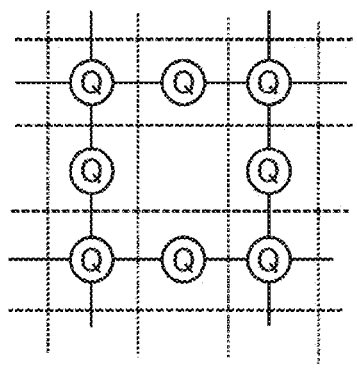
FIG. 36 is an equivalent circuit diagram of a basic array corresponding to a layout of FIG. 35.
Figure 37:
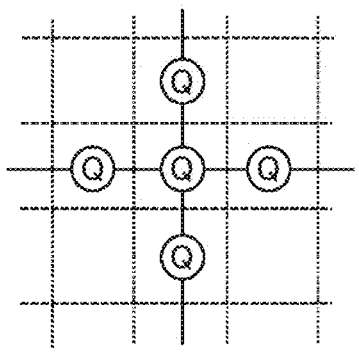
FIG. 37 is an equivalent circuit diagram of a basic array corresponding to the layout of FIG. 35.
Figure 38:
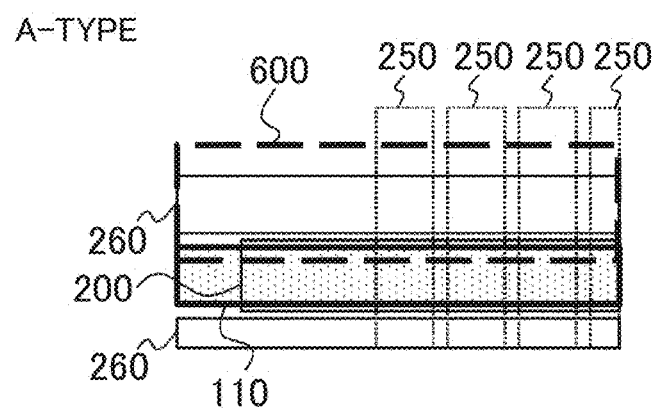
FIG. 38 is a planar arrangement diagram of a basic cell (A-type)
Figure 39:
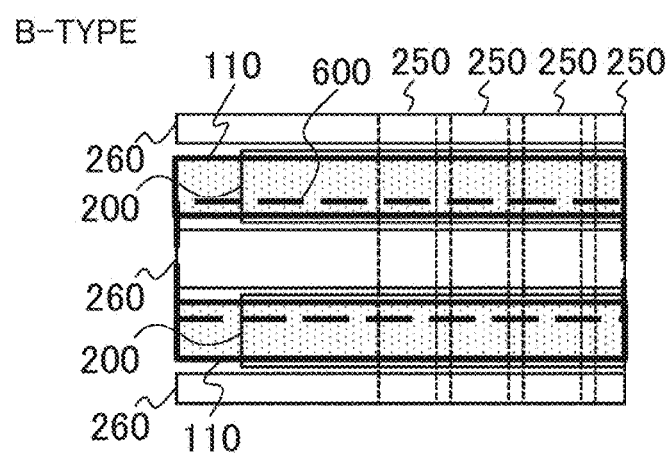
FIG. 39 is a planar arrangement diagram of a basic cell (B-type)
Figure 40:
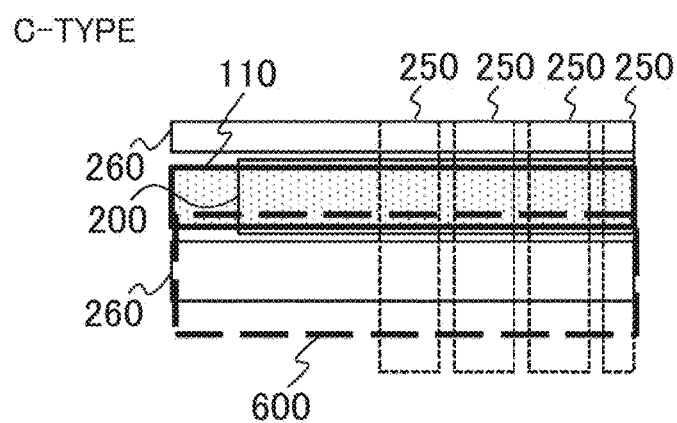
FIG. 40 is a planar arrangement diagram of a basic cell (C-type)
Figure 41:
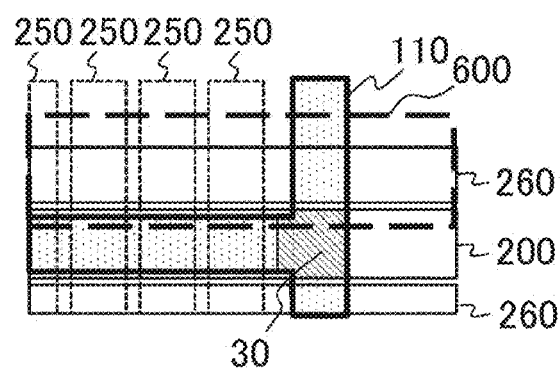
FIG. 41 is a planar arrangement diagram of a basic cell (G-type)
Figure 42:
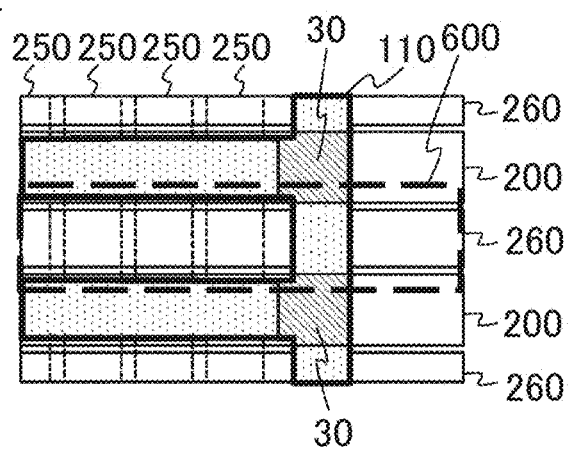
FIG. 42 is a planar arrangement diagram of a basic cell (H-type)
Figure 43:
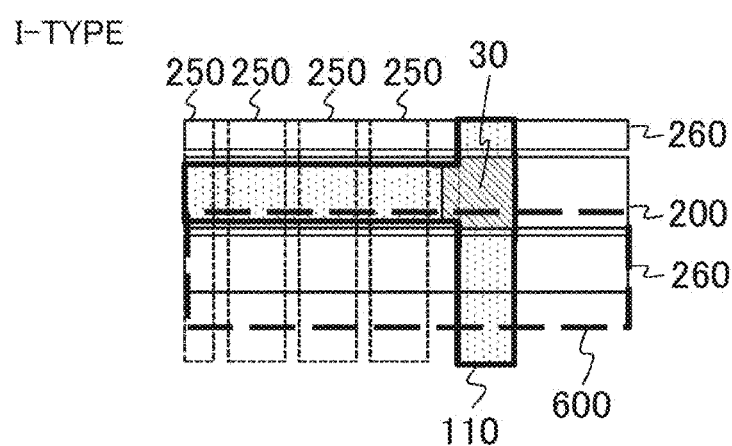
FIG. 43 is a planar arrangement diagram of a basic cell (I-type)
Figure 44:
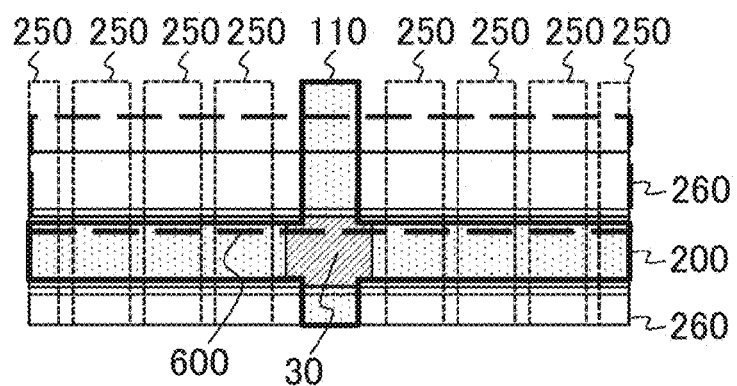
FIG. 44 is a planar arrangement diagram of a basic cell (D-type)
Figure 45:
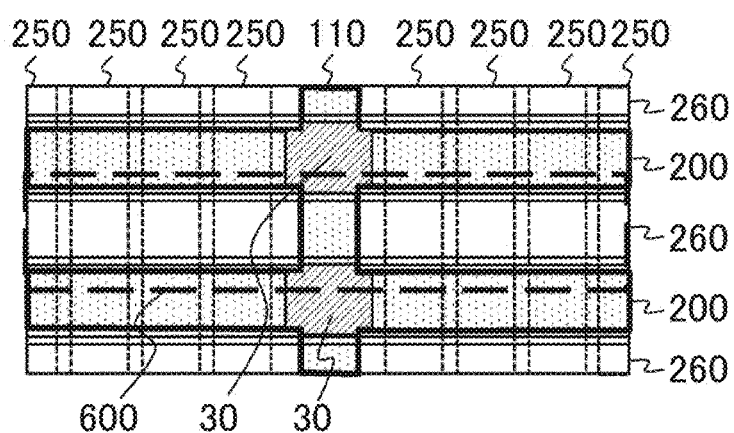
FIG. 45 is a planar arrangement diagram of a basic cell (E-type)
Figure 46:
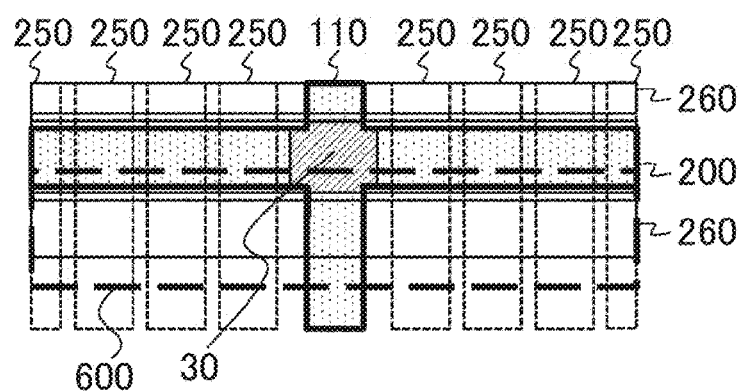
FIG. 46 is a planar arrangement diagram of a basic cell (F-type)

There is shown in FIG. 35, a qubit array configured by using the basic cell 82 (shown by enclosing it with a one-dot chain line) shown in FIG. 33 and arranging the four basic cells 82 vertically and horizontally. The qubit array of FIG. 35 can also be seen as a repeat of a basic array (FIG. 36) in which qubits are arranged by alternately connecting the same vertically and horizontally, or can also be seen as a repeat of a basic array (FIG. 37) in which five qubits are connected. They can be used properly according to the algorithm used for the qubit operation.

(Qubit Array 4)

Description will be made as to the case where a scalable qubit array can be configured by the qubit array using the signal amplifying element of the present embodiment. FIGS. 38 to 46 show basic cells required when configuring the qubit array. There is shown in each of FIGS. 47 and 48, an example of a qubit array configured by arranging these basic cells (A to I types). The basic cell shown here includes a silicon active region 110, gate lines 200 and 260 used for signal amplification extending in the horizontal direction in the figure, and gate lines 250 each used for qubit control. Additionally, there is also shown a planar arrangement of a high frequency wiring 600 for applying a high frequency signal effective for qubit spin manipulation. The high frequency wiring 600 extends in the same direction as the gate lines 200 and 260. The high frequency wiring 600 is formed of a metal wiring. Since the high frequency wiring 600 is famed above the element structure which has been described so far, it can be arranged without affecting the element structure. Incidentally, the number of gate lines included in the basic cell in each of FIGS. 38 to 46 is an example, but is not limited to the number illustrated in the figures.

Figure 47:
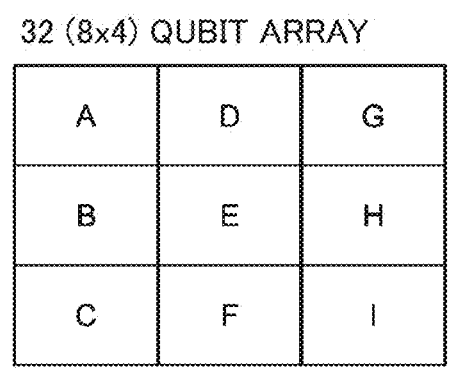

FIG. 47 is a configuration example of an array in which 32 qubits are arranged, and FIG. 48 is a configuration example of a qubit array in which 128 qubits are arranged. As can be seen from this example, it is possible to configure an array having a desired number of qubits by increasing cells other than the four-corner A-type, C-type, G-type and I-type.

Figure 49:
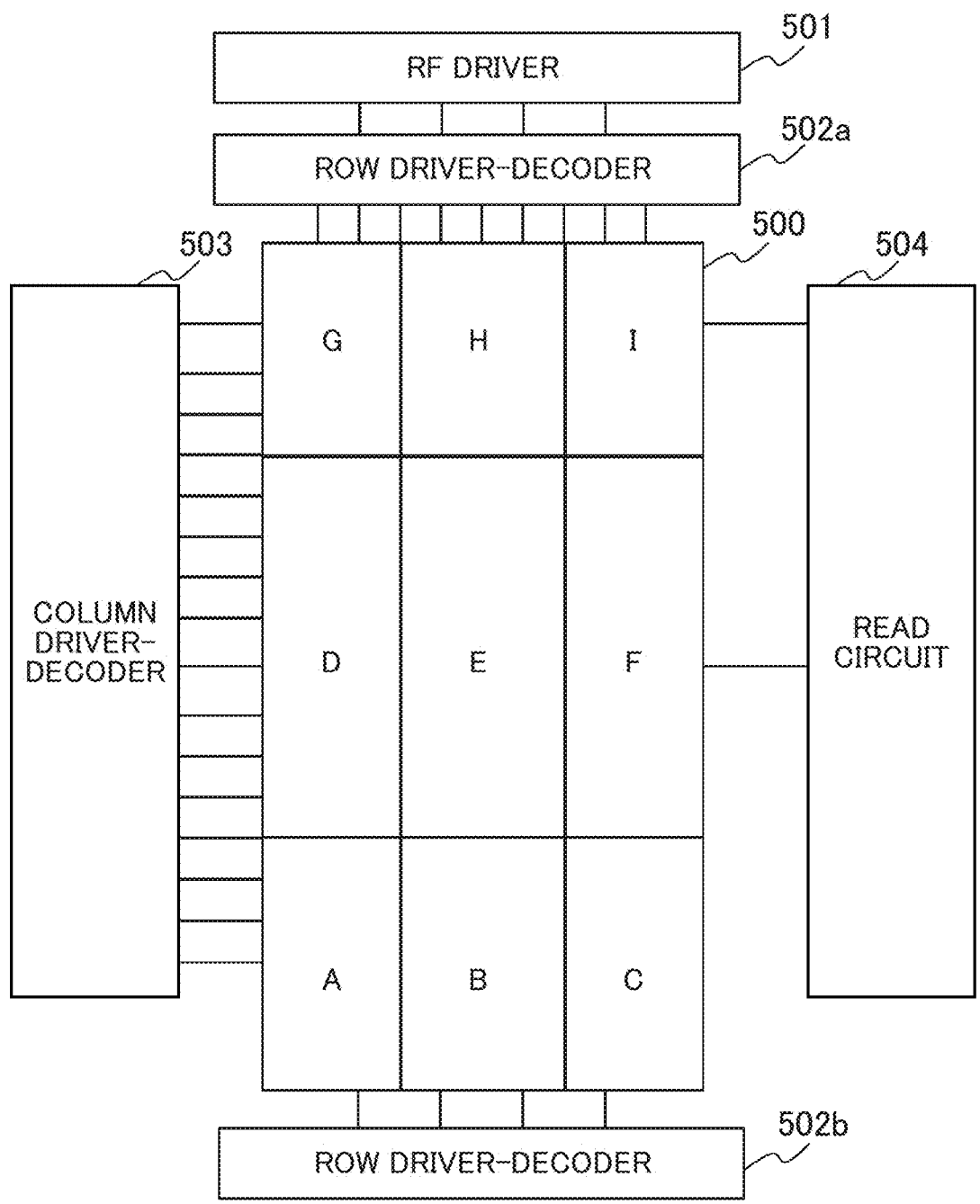
FIG. 49 is an arrangement example of a qubit array and its peripheral circuits.

There is shown in FIG. 49, one in which peripheral circuits are arranged in the 32 qubit array shown in FIG. 47. The peripheral circuits are provided with respect to a qubit array 500. The peripheral circuits include an RF driver 501, a row driver-decoder 502, a column driver-decoder 503, and a read circuit 504. The high frequency wiring 600 is connected to the RF driver 501, the gate lines 200 and 260 used for signal amplification are connected to the row driver-decoder 502, the gate lines 250 used for qubit control are connected to the column driver-decoder 502, and the signal amplifying element is connected to the read circuit 504.

The embodiment of the present invention has been described above. Modifications applicable to the present embodiment will be described below.

(First Modification)

Figure 50:
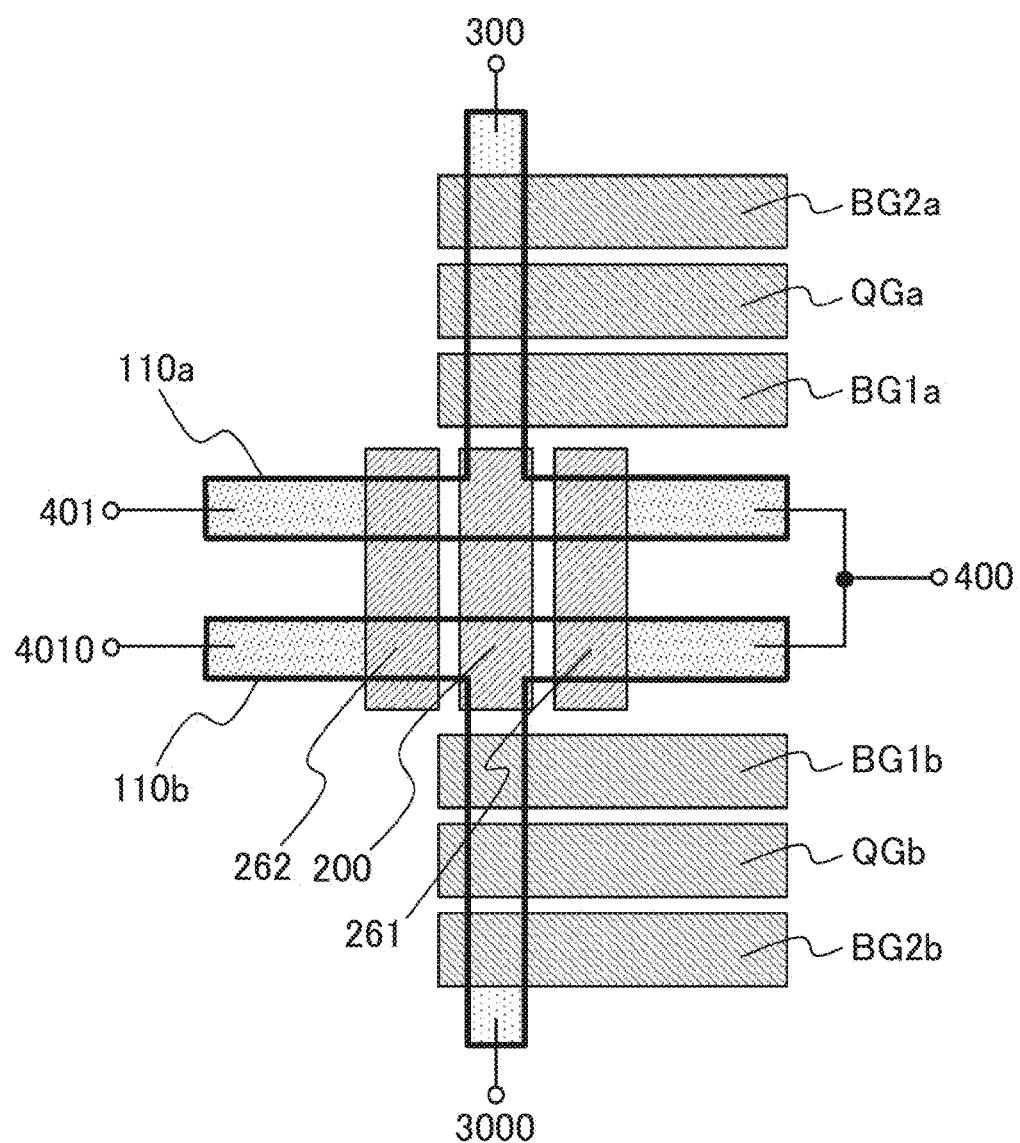
FIG. 50 is a planar arrangement diagram of a charge signal amplifying element.
Figure 51:
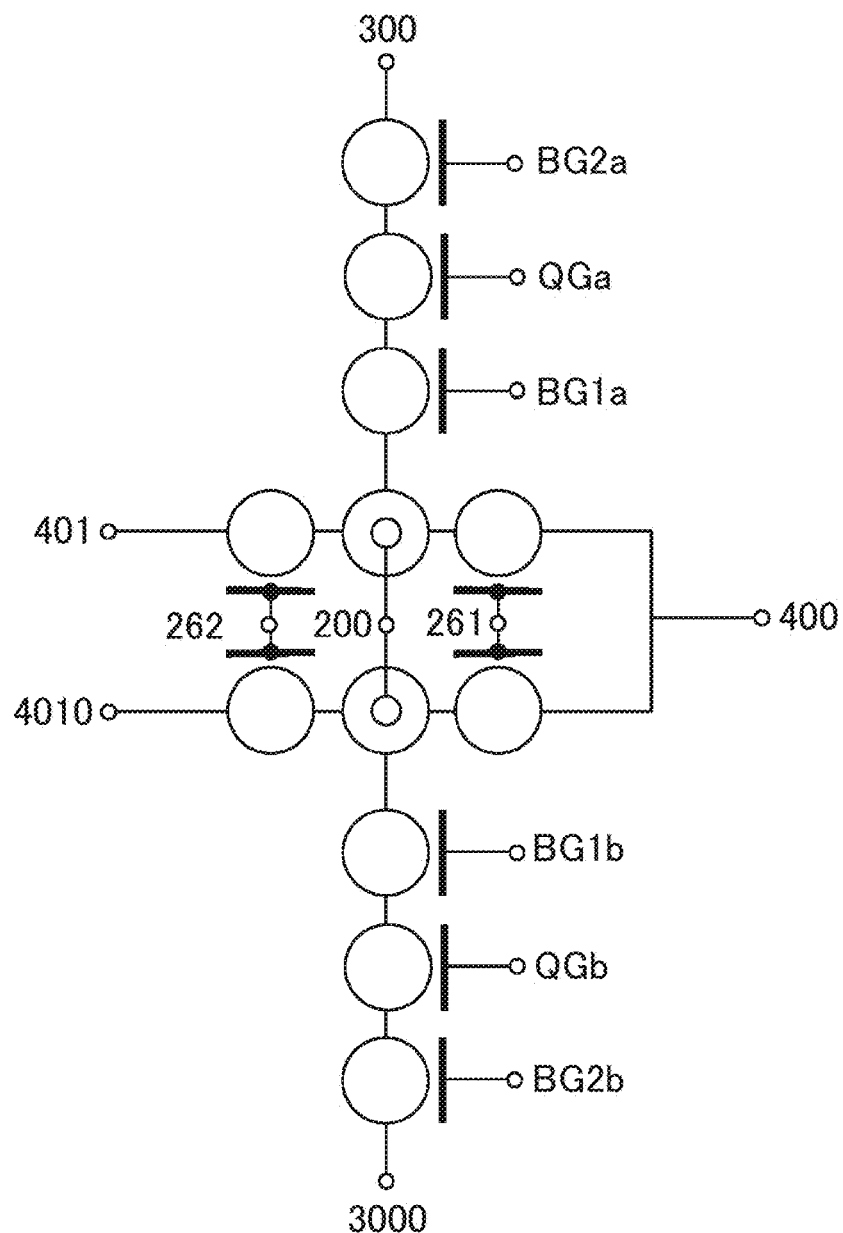
FIG. 51 is an equivalent circuit diagram corresponding to FIG. 50.

As a first modification, there is shown a signal amplifying element famed by arranging the signal amplifying element shown in FIG. 16 upside down and arranging the same in parallel. FIG. 50 is a planar arrangement diagram, and FIG. 51 is an equivalent circuit diagram corresponding to a layout of FIG. 50. A differential operation of comparing a current flowing between diffusion layer electrodes 400 and 401 arranged in parallel and a current flowing between the diffusion layer electrode 400 and a diffusion layer electrode 4010 is made to be executed, thereby making it possible to obtain higher detection accuracy. Alternatively, the upper-stage signal amplifying element is used as a detecting element, the lower-stage signal amplifying element is used as a reference element, and the known number of electrons is trapped under a qubit gate QGb for the reference element, whereby it is possible to directly grasp the number of electrons from the differential output between the upper-stage signal amplifying element and the lower-stage signal amplifying element.

(Second Modification)

As a second modification, there is shown a configuration example in which a path for reset of a signal amplifying element is provided separately. In the signal amplifying element of the present embodiment, the carriers having the different polarities are used, and one of them is trapped to carry the signal information, and the other thereof carries the amplified current. Therefore, the signal amplifying element of FIG. 16 has been provided with the path (the extension portion corresponding to the T-shaped vertical bar of the silicon active region 110) to introduce the electron under the gate 200, and the path (the extension portion corresponding to the T-shaped horizontal bar of the silicon active region 110), which serves as an inlet and an outlet for the amplified current to flow.

Figure 52:
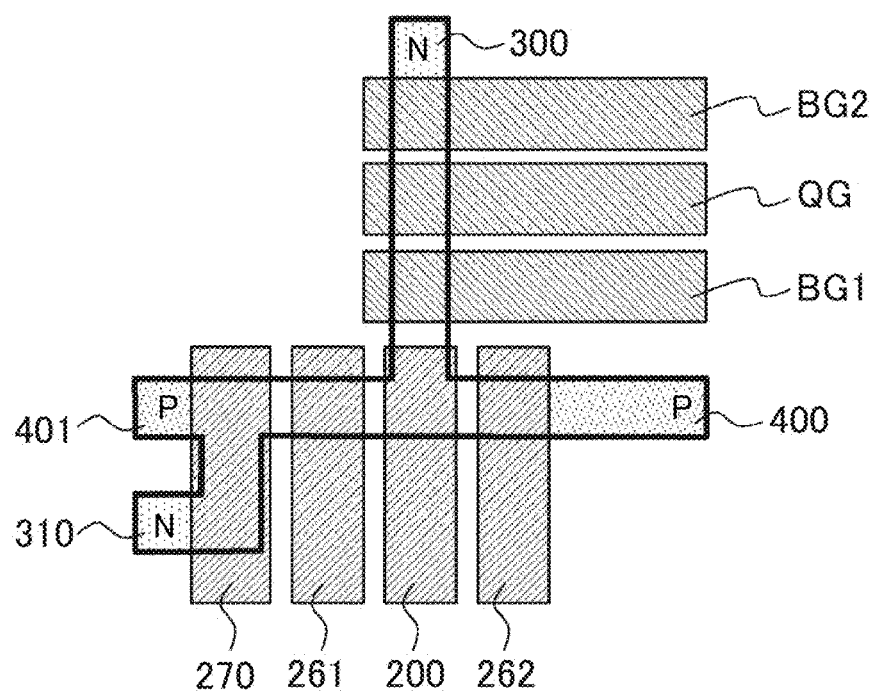
FIG. 52 is a planar arrangement diagram of a charge signal amplifying element.
Figure 53:
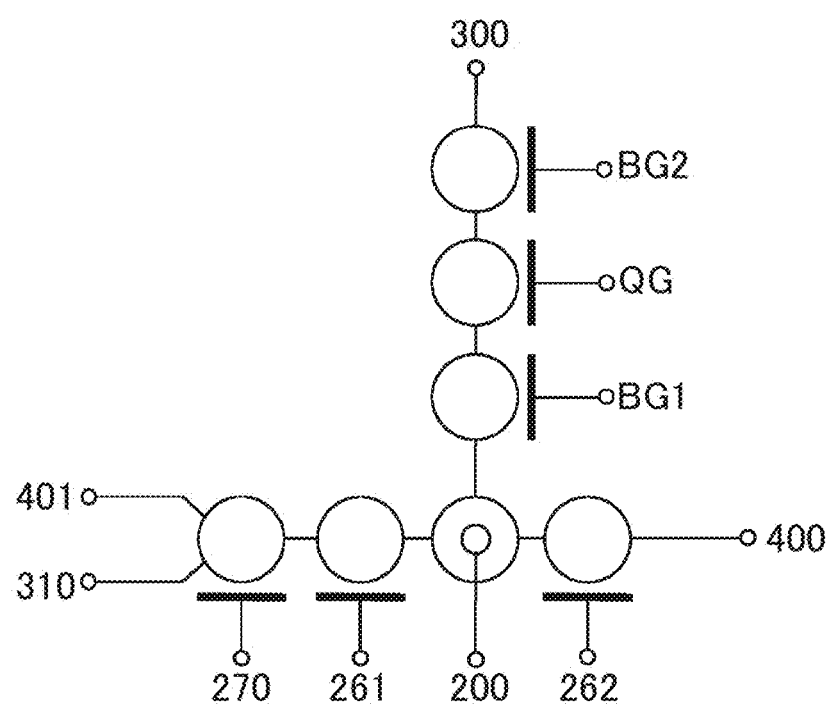
FIG. 53 is an equivalent circuit diagram corresponding to FIG. 52.

On the other hand, the present modification is configured as in an equivalent circuit diagram (FIG. 53) using a planar arrangement diagram of FIG. 52 and its equivalent circuit symbols, whereby it is also possible to cause the electrons to disappear by using the same path as the outflow port of the hole current. A diffusion layer electrode 310 of a first conductivity type is arranged by separating a flow path between diffusion layer electrodes 400 and 401. After current measurement (reading), the electrons trapped under the gate 200 are made to flow into the diffusion layer electrode 310 through the corresponding gate electrodes 261 and 270 to thereby make it possible to initialize (reset) the area under the gate 200 into a non-electronic state. In the layout of FIG. 52, the carriers are distributed at one gate 270, but when a leakage current is generated due to the inter-band tunnel phenomenon, independent gates are respectively placed for the diffusion layer electrode 401 and the diffusion layer electrode 310 to thereby make it possible to relax the electric field and avoid the leakage current.

Figure 54:
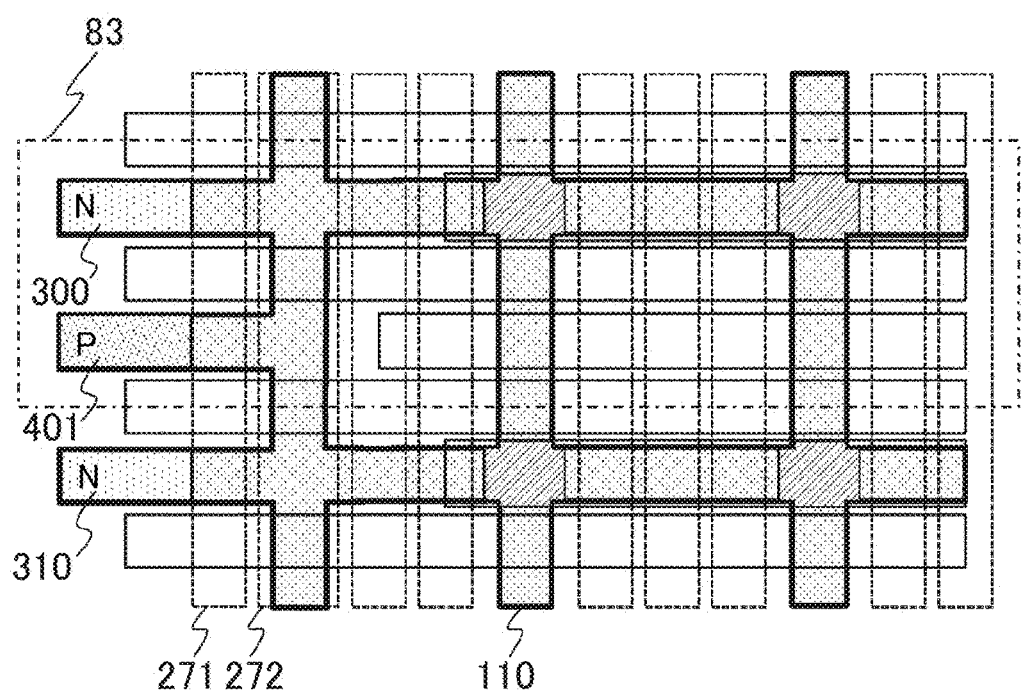
FIG. 54 is a planar arrangement diagram where the charge signal amplifying element of FIG. 52 is mounted on a qubit array.

FIG. 54 shows a layout example where applied to a qubit array. A basic cell 83 in this case is shown by enclosing it with a one-dot chain line. Since the silicon active region 110 has an extension portion in the vertical (longitudinal) direction and an extension portion in the horizontal (lateral) direction, a gate line 271 for controlling a horizontal (lateral) path and a gate line 272 for controlling a vertical (longitudinal) path are provided. Since the silicon active region 110 can be used for an electron and positive hole movement path, the signal amplifying element for reading can be freely arranged in the array.

What is claimed is:

1. A semiconductor device comprising:
   a first active region formed in a semiconductor layer formed on an insulating film formed in a semiconductor substrate and having a first extension portion extending in a first direction and a second extension portion extending in a second direction intersecting with the first direction;
   a first diffusion layer electrode of a first conductivity type provided in the first extension portion;
   second and third diffusion layer electrodes of a second conductivity type provided in the second extension portion so as to interpose a first connecting portion connecting the first extension portion and the second extension portion;
   a first gate electrode formed on the first extension portion between the first diffusion layer electrode and the first connecting portion through an insulating film formed on the semiconductor layer; and
   a second gate electrode formed on the first connecting portion through the insulating film formed on the semiconductor layer.

2. The semiconductor device according to claim 1, wherein after carriers of the first conductivity type under the first gate electrode are transferred under the second gate electrode, a potential gradient is applied between the second diffusion layer electrode and the third diffusion layer electrode, and
   wherein the number of the first conductivity type carriers transferred from under the first gate electrode to under the second gate electrode is detected based on a current caused by the carriers of the second conductivity type flowing between the second diffusion layer electrode and the third diffusion layer electrode by the potential gradient.

3. The semiconductor device according to claim 1, including:
   a third gate electrode formed on the second extension portion between the second diffusion layer electrode and the first connecting portion through the insulating film formed on the semiconductor layer, and
   a fourth gate electrode formed on the second extension portion between the third diffusion layer electrode and the first connecting portion through the insulating film formed on the semiconductor layer.

4. The semiconductor device according to claim 3, including:
   a second active region formed in the semiconductor layer and having a third extension portion extending in the first direction and a fourth extension portion extending in the second direction;
   a fourth diffusion layer electrode of the first conductivity type provided in the third extension portion;
   fifth and sixth diffusion layer electrodes of the second conductivity type provided in the fourth extension portion so as to interpose a second connecting portion connecting the third extension portion and the fourth extension portion; and
   a fifth gate electrode formed on the third extension portion between the fourth diffusion layer electrode and the second connecting portion through the insulating film formed on the semiconductor layer,
   wherein the second gate electrode is arranged on the second connecting portion through the insulating film formed on the semiconductor layer,
   wherein the third gate electrode is arranged on the fourth extension portion between the fifth diffusion layer electrode and the second connecting portion through the insulating film formed on the semiconductor layer,
   wherein the fourth gate electrode is arranged on the fourth extension portion between the sixth diffusion layer electrode and the second connecting portion through the insulating film formed on the semiconductor layer, and
   wherein the second diffusion layer electrode and the fifth diffusion layer electrode are electrically connected to each other.

5. The semiconductor device according to claim 4,
   wherein a potential gradient is applied between the second diffusion layer electrode and the third diffusion layer electrode and between the fifth diffusion layer electrode and the sixth diffusion layer electrode, and
   wherein a current caused by the second conductivity type carriers flowing between the second diffusion layer electrode and the third diffusion layer electrode by the potential gradient, and a current caused by the second conductivity type carriers flowing between the fifth diffusion layer electrode and the sixth diffusion layer electrode by the potential gradient are compared to each other.

6. The semiconductor device according to claim 1,
   wherein the first active region has a branch portion branching from the second extension portion, and the branch portion is provided with a seventh diffusion layer electrode of the first conductivity type, and
   wherein in order to selectively make either the third diffusion layer electrode or the seventh diffusion layer electrode conductive with the first connecting portion, a gate electrode is provided on the first extension portion between the third diffusion layer electrode and the seventh diffusion layer electrode and the first connecting portion through the insulating film formed on the semiconductor layer.

7. The semiconductor device according to claim 1, wherein the impurity concentration of the semiconductor layer is set to be an impurity concentration at which a field effect transistor having the semiconductor layer, the insulating film formed on the semiconductor layer, and the gate electrode formed on the insulating film becomes an intrinsic channel, and the threshold value of the field effect transistor is set by a work function of a material for the gate electrode.

8. A semiconductor device comprising:
an active region formed in a semiconductor layer formed on an insulating film formed in a semiconductor substrate and having a plurality of first extension portions extending in a first direction and a plurality of second extension portions extending in a second direction intersecting with the first direction;
a first diffusion layer electrode of a first conductivity type provided at an end of the first extension portion;
second and third diffusion layer electrodes of a second conductivity type provided at both ends of the second extension portion;
first to third gate electrodes formed, via the insulating film formed on the semiconductor layer, on the first extension portion between the intersections of the first and second extension portions, which is adjacent to the first direction;
a first gate line which extends in the second direction and connects the first gate electrodes to each other;
a second gate line which extends in the second direction and connects the second gate electrodes to each other;
a third gate line which extends in the second direction and connects the third gate electrodes to each other;
a fourth gate electrode formed on the intersection of the first extension portion and the second extension portion through the insulting film formed on the semiconductor layer;
a fifth gate electrode formed, via the insulating film formed on the semiconductor layer, on the second extension portion on the side of provision of the second diffusion layer electrode as seen from the intersection where the fourth gate electrode is provided;
a sixth gate electrode formed, via the insulating film formed on the semiconductor layer, on the second extension portion on the side of provision of the third diffusion layer electrode as seen from the intersection where the fourth gate electrode is provided;
a fourth gate line which extends in the first direction and connects the fourth gate electrodes to each other;
a fifth gate line which extends in the first direction and connects the fifth gate electrodes to each other; and
a sixth gate line which extends in the first direction and connects the sixth gate electrodes to each other,
wherein the first to third gate lines are formed in the same layer, and the second gate line and the third gate line are respectively arranged on both sides of the first gate line, and
wherein the fourth to sixth gate lines are formed in a layer above the layer where the first to third gate lines are formed.

9. The semiconductor device according to claim 8,
wherein after carriers of a first conductivity type under the first gate electrode are transferred under the fourth gate electrode, a potential gradient is applied between the second diffusion layer electrode and the third diffusion layer electrode, and
wherein the number of the first conductivity type carriers transferred from under the first gate electrode to under the fourth gate electrode is detected based on a current caused by the carriers of a second conductivity type flowing between the second diffusion layer electrode and the third diffusion layer electrode by the potential gradient.

10. The semiconductor device according to claim 8,
wherein the first gate electrode is a qubit gate which traps the first conductivity type carriers under the first gate electrode,
wherein the second and third gate electrodes are barrier gates which control the transfer of the first conductivity type carriers trapped to the qubit gate, and
wherein the fourth gate electrode operates as a qubit gate at the time of arithmetic operation and spin-to-charge conversion operation and operates as a charge signal amplifying element at the time of read operation.

11. The semiconductor device according to claim 8, including:
seventh and eighth gate electrodes formed, via the insulating film formed on the semiconductor layer, on the second extension portion between the intersection where the fourth gate electrode is provided and the intersection of the first extension portion and the second extension portion, which is adjacent to the side of provision of the third diffusion layer electrode as seen from the intersection where the fourth gate electrode is provided;
a seventh gate line which extends in the first direction and connects the seventh gate electrodes to each other, and
an eighth gate line which extends in the first direction and connects the eighth gate electrodes to each other,
wherein the seventh and eighth gate lines are formed in the same layer as the fourth to sixth gate lines, and the sixth gate line and the eighth gate line are respectively arranged on both sides of the seventh gate line.

12. The semiconductor device according to claim 11,
wherein the seventh gate electrode is a qubit gate which traps the first conductivity type carriers under the seventh gate electrode, and
wherein the sixth and eighth gate electrodes operate as barrier gates which control the transfer of the first conductivity type carriers trapped to the qubit gate at the time of arithmetic operation and spin-to-charge conversion operation.

13. The semiconductor device according to claim 8, wherein the impurity concentration of the semiconductor layer is set to be an impurity concentration at which a field effect transistor having the semiconductor layer, the insulating film formed on the semiconductor layer, and the gate electrode formed on the insulating film becomes an intrinsic channel, and the threshold value of the field effect transistor is set by a work function of a material for the gate electrode.

14. The semiconductor device according to claim 8, which is mounted in a refrigerating machine which is capable of cooling to a state of a low temperature of 3K or less and is operated in a low temperature state.

* * * * *